(12) United States Patent
Thompson et al.

(10) Patent No.: US 11,843,387 B1
(45) Date of Patent: Dec. 12, 2023

(54) TX-RX SYNCHRONIZATION FOR REFLECTIVE OPTOELECTRONIC SYSTEMS IN PORTABLE ELECTRONIC DEVICES

(71) Applicant: Apple Inc., Cupertino, CA (US)

(72) Inventors: Susan A. Thompson, Half Moon Bay, CA (US); Anup K. Sharma, Sunnyvale, CA (US); Christopher G Zeleznik, San Jose, CA (US); Harish Venkataraman, Half Moon Bay, CA (US)

(73) Assignee: Apple Inc., Cupertino, CA (US)

( * ) Notice: Subject to any disclaimer, the term of this patent is extended or adjusted under 35 U.S.C. 154(b) by 195 days.

(21) Appl. No.: 17/395,234

(22) Filed: Aug. 5, 2021

Related U.S. Application Data

(60) Provisional application No. 63/072,779, filed on Aug. 31, 2020.

(51) Int. Cl.
*H03L 7/085* (2006.01)
*H03L 7/081* (2006.01)
*H05B 47/10* (2020.01)

(52) U.S. Cl.
CPC .............. *H03L 7/085* (2013.01); *H03L 7/081* (2013.01); *H05B 47/10* (2020.01)

(58) Field of Classification Search
CPC . H03L 7/08; H03L 7/081; H03L 7/099; H03L 7/0991; H03L 7/0992; H03L 7/085; H05B 47/10
See application file for complete search history.

(56) References Cited

U.S. PATENT DOCUMENTS

| | | | |
|---|---|---|---|
| 5,389,898 A | 2/1995 | Taketoshi et al. | |
| 7,969,202 B2 | 6/2011 | Lin et al. | |
| 8,618,967 B2 | 12/2013 | Nikaeen et al. | |
| 8,634,512 B2 | 1/2014 | Leung et al. | |
| 8,692,598 B2 | 4/2014 | Havens | |
| 8,884,672 B2 | 11/2014 | Ballantyne et al. | |
| 9,461,653 B2 | 10/2016 | Perrott | |
| 10,191,453 B2 | 1/2019 | Pavlovic et al. | |
| 10,505,554 B2 | 12/2019 | Schell et al. | |
| 10,516,401 B2 | 12/2019 | Janardhanan et al. | |
| 2015/0372681 A1* | 12/2015 | Melanson | H03L 1/028 331/1 R |
| 2020/0111016 A1 | 4/2020 | Boothby | |

FOREIGN PATENT DOCUMENTS

JP 4197251 12/2008

* cited by examiner

*Primary Examiner* — Georgia Y Epps
*Assistant Examiner* — Don J Williams
(74) *Attorney, Agent, or Firm* — Brownstein Hyatt Farber Schreck, LLP

(57) ABSTRACT

An optoelectronic system includes a transmit side and a receive side. The transmit side and the receive side each include an oversampled phase locked loop configured to receive a decimated system clock signal. Each phase-locked loop is configured to output a high frequency sampling clock signal that, in the case of the transmit side, may be leveraged to generate an arbitrary current waveform that, in turn, can be delayed by a delay-locked loop before being applied to a current-controlled light emitting element. The receive side can generate a clock signal at the same high frequency as the transmit side and can be configured to trigger a reset of the transmit side so that the high frequency clock signals between the transmit and receive sides are synchronized.

20 Claims, 7 Drawing Sheets

TX-RX SYNCHRONIZATION FOR REFLECTIVE OPTOELECTRONIC SYSTEMS IN PORTABLE ELECTRONIC DEVICES

CROSS-REFERENCE TO RELATED APPLICATION

This application is a nonprovisional of, and claims the benefit under 35 U.S.C. § 119(e) of, U.S. Patent Application No. 63/072,779, filed Aug. 31, 2020, the contents of which are incorporated herein by reference as if fully disclosed herein.

TECHNICAL FIELD

Embodiments described herein relate to optoelectronic systems for portable electronic devices and, in particular, to systems and methods for synchronizing transmitter-side ("Tx") and receiver-side ("Rx") control electronics of optoelectronic systems for portable electronic devices.

BACKGROUND

An electronic device can include a reflective optoelectronic system. The optoelectronic system can be configured to emit modulated light and to receive reflections of that modulated light in order to obtain or generate information about an object or surface within a field of view of that system. For example, an optoelectronic system can be configured to measure distance to an object within the field of view of the system.

Performance of an optoelectronic system is typically limited by the accuracy and precision with which control electronics of a receive side and control electronics of a transmit side can be synchronized. Phrased in another way, phase difference between a transmit side and a receive side contributes to noise and imprecise measurement, especially for implementations monitoring phase difference as an input variable.

SUMMARY

Many embodiments described herein take the form of a portable electronic device that includes an optoelectronic system or subsystem. Example optoelectronic systems include, but are not limited to: point-to-point optical communication systems; time of flight depth sensors (both direct and indirect); proximity sensors; structure light sensors; and so on.

An optoelectronic system such as described herein can include a current-controlled element, such as a current-controlled light source. As used herein the term "current-controlled" refers to operations and systems that supply operational power to a circuit or circuit component by constant current control.

Power output from a power supply that feeds a current-controlled element may vary, but a magnitude of current output from that power supply is maintained at a selected value. In many cases, the selected value may be constant (e.g., a constant current output) for at least a period of time whereas in others, current output may follow or approximate a particular selected waveform, such as a sinusoidal waveform, a triangular wave, a square wave, a sawtooth wave, or an arbitrary waveform. In these examples, the current waveform output from the current-regulating power supply can supply any suitable power while maintaining current output according to a selected waveform.

As noted above, the optoelectronic system includes a current-controlled light source coupled to a controller for generating a periodic current waveform to input to the current-controlled light source. The controller (which may also be referred to as a "power source" and/or a "current waveform generator") includes a phase-locked loop configured to receive an input clock signal and to output an oversampled clock signal.

The clock signal is provided at a first frequency (typically a system clock frequency, such as 24 MHz) and the oversampled clock signal is provided at a second frequency (such as 4.8 GHz). In some constructions in which the oversampled clock frequency is not a harmonic of the clock frequency, a programmable frequency divider may be used to decimate the clock signal to a frequency that can be increased to the desired oversampled clock signal.

For example, if the clock frequency is 24 MHz, the decimator/frequency divider may have a divisor of 24 to output an intermediate clock frequency of 1 MHz, which can be oversampled to 50 MHz. In some constructions, the oversampled clock frequency can be decimated by a first voltage divider and may be used to reduce the oversampled clock signal to a lower frequency that is larger than, and in phase with, the clock signal. It may be appreciated that any suitable oversampled frequency may be selected.

The controller also includes a waveform register configured to receive, as input, the oversampled clock signal. The waveform register may be implemented as a shift register. The waveform register can be configured to change (e.g., in response to a high state of the oversampled clock signal), a digital output value corresponding to a sample of a selected waveform. In another, non-limiting phrasing, the waveform register can store a series of values that, upon each clock cycle of the oversampled clock signal received by the controller, outputs a next sequential value of the series of values as a digital output value.

The controller also includes a digital to analog current converter configured to receive the digital value output from the waveform register. In response, the digital to analog converter is configured to change a current output from the converter based on each digital value. This current output from the converter is provided as power supply to the current-controlled light source of the optical communication system. In this manner and as a result of this construction, an arbitrary waveform following any shape can be supplied to any suitable current-controlled element, at any suitable frequency, while remaining in phase with a system clock input to the controller.

For example, in some embodiments, the waveform applied to the current-controlled element may be a sinusoidal waveform. In other embodiments, a triangular waveform may be used. In yet other examples, a chirp waveform may be used. It may be appreciated that any arbitrary waveform can be applied.

Similarly, it may be appreciated, by controlling parameters of each decimator and each oversampling element, a waveform can be generated at any suitable frequency or periodicity. It may be further appreciated that, by controlling parameters and/or values loaded into the waveform register, direct current offset, phase, and other parameters of the waveform applied to the current-controlled element can be precisely controlled. For example, a direct current bias may be provided that maintains a forward biased condition of the current-controlled element.

Embodiments described herein further include a delay-locked loop configured to receive the current-controlled waveform output from the arbitrary frequency and to delay that signal by a certain quantity and, additionally, to maintain that delay. The delay may ensure a knowable time at which the arbitrary waveform output from the waveform generator is applied to the current-controlled element.

The delay-locked loop can include one or more voltage controlled delay blocks and/or one or more programmable voltage controlled delay blocks. These blocks can be arranged into delay lines that each feed into a respective one phase detector. The phase detector can determine a phase difference between its respective inputs and, in response, can output a voltage that increases or decreases a delay applied by a voltage controlled delay block within that associated delay line.

In many configurations, an auxiliary delay line can be included that can be used to emulate a delay line operably coupled to the current-controlled element. In particular, the auxiliary delay line can include at least one dummy load electrically configured to emulate the impedance response of the current-controlled element. For example, if the current-controlled element were simply a resistive load, the dummy load may be a resistor that matches the resistance of the current-controlled element. In a more advanced configuration, the dummy load may be configured to emulate any suitable input impedance, output impedance, resistance, or reactance. As may be appreciated, the dummy load may be suitably configured to emulate any suitable number of electrical properties of the current-controlled element.

In still further examples, the dummy load may be configured to emulate one or more thermal or other non-electrical properties of the current-controlled element. In other constructions, the dummy load may be configured to emulate only electrical properties of the current-controlled element specifically to calibrate for thermal effects.

As a result of these constructions, the dummy load and its associated auxiliary delay line can be configured to provide a calibration to a delay line whose output is coupled to the current-controlled element, effectively calibrating for input/output buffer errors affecting delay(s) and/or clock signals, electrical to optical conversion errors affecting delay(s) and/or clock signals, temperature change or thermal effects affecting delay(s) and/or clock signals and so on.

The foregoing described construction can be implemented in a transmit side of an optoelectronic system, such as described herein. A receive side of the same optoelectronic system (or a different optoelectronic system, such as in a communications implementation) can also include a phase-locked loop such as described above in which a system clock is oversampled and then down sampled to a desired frequency. For embodiments described herein, the factors and frequencies of the transmit side phase-locked loop may be the same as the factors and frequencies of the receive side phase-locked loop so that control electronics of each side of the optoelectronic system can have access to the same frequencies.

In order to synchronize one or more of the frequencies/clock signals of the transmit side and the receive side of the optoelectronic system, a reset signal can be sent to the lowest frequency-output decimator of each of the transmit side and the receive side phase-locked loop. More specifically, in many embodiments, the reset signal is sent to an input decimator configured to receive, and reduce, the system clock. In particular, as noted above, both the transmitter and receive side phase-locked loops can include a decimator configured to reduce a system clock (e.g., 24 MHz) to a lower frequency clock signal (e.g., 1 MHz). In this manner, and as a result of this construction, each of the transmit side and receive side phase-locked loops can begin their respective oversample/decimate operations in response to the reset signal.

In many cases, the reset signal may be a lower-frequency signal intended to control another process or operation of the optoelectronic system. In these constructions, the lower-frequency signal can be leveraged for two purposes, for the original intended purpose of the signal and as a reset signal such as described above.

For example, in many implementations, the transmit side of an optoelectronic system may be configured to strobe output of a modulated light emitting element. In other words, the light output from the transmit side of the optoelectronic system may be modulated at a high frequency and at a low frequency. In another, non-limiting phrasing, the light-emitting element may be configured to output modulated light at a high frequency in a sequence of short bursts, referred to herein as a "strobing" operation. In such configurations, an electrical signal intended to initiate a strobing operation can be leveraged for the additional purpose of resetting the input decimators of each of the transmit side and receive side phase-locked loops.

These foregoing example embodiments are not exhaustive of the configurations of a system as described herein. In particular, it may be appreciated that a system as described herein can be configured in a number of suitable ways and may be implemented to serve a number of suitable purposes. Various examples are provided below.

BRIEF DESCRIPTION OF THE DRAWINGS

Reference will now be made to representative embodiments illustrated in the accompanying figures. It should be understood that the following descriptions are not intended to limit this disclosure to one included embodiment. To the contrary, the disclosure provided herein is intended to cover alternatives, modifications, and equivalents as may be included within the spirit and scope of the described embodiments, and as defined by the appended claims.

The use of the same or similar reference numerals in different figures indicates similar, related, or identical items.

Figure 1:
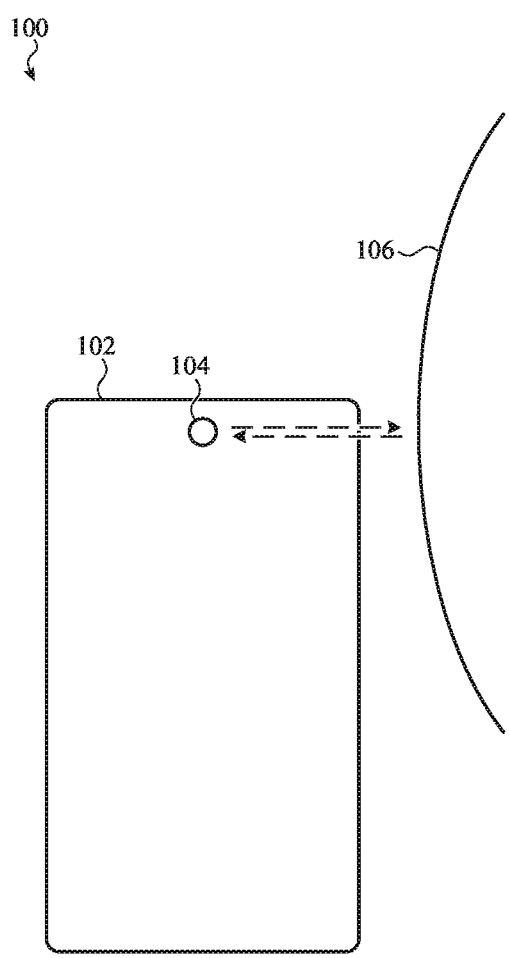
FIG. 1 depicts an example electronic device that can include a current-controlled element, such as described herein.

Certain accompanying figures include vectors, rays, traces, and/or other visual representations of one or more example paths—which may include reflections, refractions, diffractions, and so on, through one or more mediums—that may be taken by, or may be presented to represent, one or more photons, wavelets, or other propagating electromagnetic energy originating from, or generated by, one or more light sources shown or, in some cases, omitted from, the accompanying figures. It is understood that these simplified visual representations of light or, more generally, electromagnetic energy, regardless of spectrum (e.g., ultraviolet, visible light, infrared, and so on), are provided merely to facilitate an understanding of the various embodiments described herein and, accordingly, may not necessarily be presented or illustrated to scale or with angular precision or accuracy, and, as such, are not intended to indicate any preference or requirement for an illustrated embodiment to receive, emit, reflect, refract, focus, and/or diffract light at any particular illustrated angle, orientation, polarization, color, or direction, to the exclusion of other embodiments described or referenced herein.

Additionally, it should be understood that the proportions and dimensions (either relative or absolute) of the various features and elements (and collections and groupings thereof) and the boundaries, separations, and positional relationships presented therebetween, are provided in the accompanying figures merely to facilitate an understanding of the various embodiments described herein and, accordingly, may not necessarily be presented or illustrated to scale, and are not intended to indicate any preference or requirement for an illustrated embodiment to the exclusion of embodiments described with reference thereto.

DETAILED DESCRIPTION

Embodiments described herein reference an electronic device with an optoelectronic system. An optoelectronic system as described herein can be configured for a number of purposes, such as for device to device communications, proximity sensing, depth/distance sensing, and so on. For simplicity of description, the embodiments that follow reference an example construction of an optoelectronic system implemented as an optical sensing system configured to detect proximity and/or distance to an object with a field of view of the electronic device, but this is merely one example and it is appreciated that other configurations and constructions are possible.

An optical sensing system as described herein can be disposed within an interior volume of a housing of an electronic device. The optical sensing system is configured to self-calibrate in the field by precisely synchronizing clock signals provided as input to control electronics of a transmit side of the optical sensing system and a receive side of the optical sensing system. The calibrations described herein can be further leveraged to calibrate for thermal drift, for cross-talk effects, and/or for any other suitable purpose. Calibration and synchronization operations as described herein can dramatically improve both accuracy and precision of the optical sensing system, especially for optical sensing systems configured to receive or monitor phase difference (between light emitted from the transmit side and received by the receive side) as an input variable.

In many examples, an optical imaging system as described herein can be configured for use as a proximity sensor for a mobile or portable electronic device, but this is merely one example. It may be appreciated that any suitable optical sensing or imaging system can utilize the techniques and architectures described herein to receive and/or emit light. Examples include, but are not limited to: light meters; light color sensors; proximity sensors; dot projectors; rangefinders; infrared image capture systems; ultraviolet image capture systems; direct time-of-flight depth sensors; indirect time-of-flight depth sensors; and so on.

In these constructions, an optical sensing system configured to operate as a reflective optical sensor that illuminates a field of view, and monitors for reflections of emitted light within that field of view, to infer that an optically reflective object, such as a user of the electronic device, is present within the field of view.

In typical embodiments, an optical sensing system is configured to operate in the infrared wavelength band although this is not required. The optical sensing system can be disposed in any suitable location within an electronic device, such as within a bezel region surrounding a display, behind a display (and configured to emit and receive light through the display), in a sidewall of the electronic device, and so on. Many suitable constructions are possible. For simplicity of description, the embodiments that follow reference an optical sensing system positioned adjacent to and/or below a display of an electronic device. More specifically, the optical sensing system can be disposed within a bezel region circumscribing an active display area of the display or may be disposed below the active display area of the display.

In this manner, an optical sensing system can illuminate objects that are nearby the display, such as a user. As may be appreciated by a person of skill in the art, objects (such as a user) proximate to the display reflect some of the light emitted by the optical sensing system. A portion of the object-reflected light is directed back toward the display and can be captured by the optical sensing system, positioned behind the display.

The received light can be quantified and/or digitized and thereafter consumed by the electronic device to perform or inform some task. The electronic device can utilize information received from the optical sensing system to perform any suitable task or operation or sets thereof. Examples include, but are not limited to: disabling or reducing a brightness of a display of the electronic device in response to receiving information from the optical sensing system that an object is closer than a threshold distance to the electronic device; enabling or increasing a brightness of a display of the electronic device in response to receiving information from the optical sensing system that an object is farther than a threshold distance to the electronic device; enabling or disabling a touch or force input system of the electronic device in response to receiving information from the optical sensing system that an object is nearby (e.g., a distance satisfying a threshold or within a threshold range) the electronic device; and so on.

In many embodiments, an optical sensing system includes a module enclosure divided into two portions, referred to herein as a transmit side and a receive side. The transmit side and the receive side are each defined by a respective one barrel defining a respective imaging aperture at one end. Within the transmit side barrel, or more simply the transmitter barrel, is disposed a light-emitting element. In one example, the light-emitting element is a vertical-cavity surface-emitting laser ("VCSEL"), or an array thereof. In other examples, a light-emitting diode, an edge-emitting laser, a horizontal cavity surface-emitting laser, resonant cavity light-emitting diode, superluminous diodes, and so on (or arrays thereof) may be used. The light-emitting element is configured to receive an electrical current (e.g., from a digital-to-analog converter) and, in response, to emit light at a particular wavelength, at a particular bandwidth, and/or at a particular power (e.g., brightness).

The receive side barrel encloses a photosensor, also referred to as a "photosensitive element." An example of a photosensor is a photodiode configured to generate a current proportional to intensity or integrated radiant flux of light illuminating the photodiode. In other cases, other photosensitive elements can be used.

As noted above, in typical constructions, the module enclosure of the optical sensing system is coupled to a rear surface of a display or coupled to an interior surface of a bezel region surrounding the display, positioned relative to an active display area of that display. As a result of this construction, light emitted from the light-emitting element on the transmit side of the optical sensing system can pass through inter-pixel regions of the active display area or through the bezel region to exit the electronic device and illuminate one or more objects external to the electronic device within a field of view of the light-emitting element.

If an object is present, such as a user, at least a portion of the light emitted by the light-emitting element will be reflected and will traverse through inter-pixel regions of the display (and/or the bezel region) to enter the imaging aperture of the receive side to illuminate the photosensitive element. In this manner, current or voltage (or power) output from the photosensitive element can be used to infer whether an object is nearby the electronic device; the higher the current, the higher the likelihood that an object is proximate to the electronic device. In other cases, a phase of light received by the photosensitive element can be compared to a phase of light emitted by the light-emitting element. The phase difference can correspond to a distance separating the photosensitive element and an external surface of the object/user. Such constructions can be referred to as "time-of-flight" proximity/depth sensors.

However, as noted above, interferences can occur that can contribute to phase errors that, in turn, may be interpreted by the optical sensing system as changes in distance. For example, if a clock signal provided as input to control electronics of the receive side are not precisely synchronized with control electronics of the transmit side, the receiver-side control electronics may incorrectly determine that a phase different due to movement of the object has occurred. In other words, if the receive side and transmit side clocks are not precisely synchronized, precision and accuracy of the optical sensing system may be substantially reduced.

In other cases, thermal effects may result in phase errors. For example, as a user of a portable electronic device incorporating an optical sensing system such as described herein holds that device in the user's hand, ambient temperature and/or a user's body heat (in addition to self-heating or self-cooling of the portable electronic device and/or optical sensing system) may either heat or cool the electronic device and, by extension, the optical sensing system. This change in temperature may affect one or more operational characteristics of circuitry supplying clock signals to control electronics of the receive side or transmit side which, in turn, can result in phase differences especially if a temperature gradient exists between the transmit side and the receive side.

More particularly, when stimulated or driven by the same drive current, the light-emitting element may emit light at a slightly different wavelength or divergence depending only on the temperature of the light-emitting element. In other cases, brightness or intensity of the light emitted from the light-emitting element may increase or decrease. This change in light output by the light-emitting element may be received at the photosensitive element and may be interpreted as a change, such as phase change, induced by the object. More particularly, the electronic device may interpret that a user has moved away from or closer to the electronic device. In some cases, the change in light received by the photosensitive element can cause the electronic device to incorrectly determine that a user is no longer present.

As may be appreciated by a person of skill in the art, small phase differences may affect systems and circuits to a greater degree for higher frequencies. For example, a phase difference resulting from a time delay of a nanosecond between two clock signals operating at 24 MHz may correspond to a ~9 degree phase offset or a ~2.5% phase error, whereas a nanosecond delay/offset between two clock signals operating at 4.8 GHz may correspond to a phase offset of ~1700 degrees or a ~500% phase error. As such, conventional systems have found it difficult to accurately synchronize high frequency clocks driving different circuits in an electronic device, such as the transmit side and the receive side of an optical sensing system.

One conventional solution is to conductively couple clock inputs of a transmit side and a receive side. However, as may be appreciated by a person of skill in the art, trace length may substantially impact synchronization. For example, as may be known to a person of skill in the art, the speed with which a voltage signal can propagate through a conductive medium is around 0.27 mm/ns. Accordingly, continuing the preceding example, a 1 ns delay between two conductively coupled clock signals may be imparted for every 0.27 mm of difference in length between electrical traces supplying the clock signal to each of a transmit side and a receive side. It may be difficult to construct a system that precisely controls trace length and, additionally, it may be difficult to account for changes in trace length that may result from temperature changes in the field. As such, the conventional solution of conductively coupling two clock inputs to the same clock signal may not be suitable for certain high frequency implementations, such as those described herein.

Other conventional solutions may leverage low-voltage differential signaling. In particular, a receive-side clock signal can be coupled to a transmit-side clock input through a differential signaling technique. However, as with other conductive signaling techniques, phase error may be present due in part to the physical length and/or physical properties of the conductors and insulators coupling receive-side and transmit-side electronics. In addition, electronics to leverage differential signaling may impart different phase errors that may be difficult to correct downstream. Such systems may also generate high-frequency noise and/or may capacitively couple to other adjacent circuitry.

Other conventional solutions rely on an optical coupling between a transmit side and a receive side. In such cases, however, the coupling itself may change with temperature and, as a result, may confer different, temperature-dependent, phase offsets between clock signals. In addition, optical coupling techniques may be difficult to manufacture, may impart operational delays, and/or may not be preferred for certain implementations.

To account for these and other shortcomings of conventional high-frequency clock synchronization techniques, the embodiments described herein reference a technique of synchronizing two low frequency clock signals that, in turn, are configured to drive higher frequency operations. As a result of these constructions, high frequency components of a transmit side and a receive side of an optical sensing system, optoelectronic system, or other high-frequency system can be ensured. Further, the synchronization trigger is supplied by a receive side so as to ensure that any delays inherent to operation of the system (e.g., fixed delays, signaling delays, and so on) cause the transmit side to lag the receive side by a fixed amount. As a result, a delay line on the transmit side can be finely tuned to compensate.

In addition, embodiments described herein relate to systems and methods for generating an arbitrary waveform (to drive a light-emitting element) at high resolution. The waveform may be a current waveform or a voltage waveform, although for simplicity of description and illustration the embodiments that follow reference systems and methods for generating a current waveform. As used herein, the term "high frequency" may be used in relation to a system clock or peripheral clock signal used in an electronic circuit, such as may be found within an electronic device.

More specifically, a system as described herein can be configured to operate as a regulated power supply configured for constant current operation, meaning that independent of load impedance, the power supply maintains a selected output current. The selected output current may be static or may change over time according to a selected waveform, such as described herein.

In this manner, it may be appreciated that the term "constant current operation" as used herein does not imply or restrict the embodiments to those only providing unchanging, substantially static, output current values. Instead, it may be appreciated that the term refers to an operational mode of a power supply in which changes in load impedance may result in changes in voltage across the load, but do not result in changes in current output by the power supply. For simplicity of description, a system as described herein can be referenced as an "arbitrary waveform generator" or, more particularly, an "arbitrary current waveform generator."

An arbitrary current waveform generator, as described herein, includes a phase-locked loop and, in particular, an oversampled phase-locked loop. In many constructions, the phase-locked loop includes a phase detector (also referred to as a phase comparator) configured to receive, as input, a system (or peripheral) clock (e.g., 24 MHz) that has been decimated to a desired base input frequency (e.g., 1 MHz). The phase detector is also configured to receive an input and a feedback clock.

The phase detector is configured to output a voltage that corresponds to a phase difference between the downsampled/decimated system clock and the feedback clock. This voltage may be referred to as a "control voltage."

The control voltage may be optionally amplified by an amplifier (such as a charge pump), but this may not be required of all embodiments. The control voltage output from the phase detector is supplied as input to a voltage controlled oscillator that may be configured to oscillate at a frequency greater than (and, in many cases, a harmonic of) the decimated system clock.

The voltage controlled oscillator is coupled to a first decimator (also referred to as a frequency divider) that reduces the frequency output from the voltage controlled oscillator by a first factor. The first decimator is coupled to a second decimator that, in many examples, further reduces frequency output from the first decimator by a second factor.

Once the frequency output from the voltage controlled oscillator is reduced by the first factor and the second factor, it may be precisely equal to the decimated system clock. As a result, this output can be used as the feedback clock signal to ensure that the phase-locked loop stays in phase with the system clock, despite that within the phase-locked loop different frequencies are present.

The foregoing described phase-locked loop structure can be included in both a transmitter and a receiver of an optical sensing system, as described herein.

As one example implementation of the foregoing described construction, a system clock of 24 MHz may be used, decimated to 1 MHz by the input decimator. The voltage controlled oscillator may be configured to oscillate at 4.8 GHz, or a factor of 200 times greater than the system clock. The first decimator may divide the 4.8 GHz signal output from the voltage controlled oscillator by a factor of 16 (the first factor), resulting in a 300 MHz signal. The second decimator may divide the 300 MHz signal output from the first decimator by a factor of 300 (the second factor), resulting in a 1 MHz signal that can be synchronized with the decimated system clock by the phase detector. In this manner, all frequencies present throughout the phase-locked loop are in phase with the system clock.

In view of these foregoing described examples, it may be appreciated that as a result of this construction, a frequency output from the first decimator can be tuned to any desirable frequency between the decimated system clock and the oversampled system clock. Phrased in another, non-limiting, manner, an arbitrary current waveform generator can include a phase-locked loop, that is (1) locked in phase with a system clock and (2) configured to generate a stable clock signal at any arbitrary frequency that is greater than the system clock value. In particular, output from the first decimator can be tapped and provided to another circuit as an input clock signal. As such, in these constructions, a phase-locked loop can receive, as input, a system or peripheral clock and can provide, as output, a second clock signal precisely in phase with the system clock and having a higher frequency than the system clock signal. The second clock signal can, as noted above, be provided at any suitable frequency.

The (second) clock signal output from the phase-locked loop can be provided as a clock input to a shift register. The shift register can be configured in a number of suitable ways, but for many embodiments described herein the shift register is configured as a parallel in/parallel out shift register. The shift register can be preloaded or cached with one or more discrete digital values, stored in preceding shift registers or other memory structures. As a result of these constructions, for each cycle of the (second) clock signal output from the phase-locked loop, the shift register transitions to a next subsequent value of the set of preloaded values.

For example, the shift register may include four parallel inputs and four parallel outputs. In this construction, the shift register may be characterized as a four bit shift register. The shift register can be coupled to a memory structure configured to store four bytes. In one example, the four bytes can correspond to the decimal numbers 1, 2, 3, and 4. In this construction, on the rising edge of a first clock cycle, the shift register outputs a four bit binary representation of the digital number 1 (e.g., 0001), as stored in the memory structure. At the rising edge of the next clock cycle, the shift register changes its output to the next value stored in the memory structure, outputting a four bit binary representation of the digital number 2 (e.g., 0010), as stored in the memory structure. At the rising edge of the next clock cycle, the shift register changes its output to the next value stored in the memory structure, outputting a four bit binary representation of the digital number 3 (e.g., 0011), as stored in the memory structure. Next, at the rising edge of the next clock cycle, the shift register changes its output to the next value stored in the memory structure, outputting a four bit binary representation of the digital number 4 (e.g., 0100), as stored in the memory structure.

Thereafter, in many embodiments (although not required), the shift register and/or memory structure can be configured to cycle back to the digital value 1, cyclically repeating the foregoing iteration. In this manner, the four bit shift register cycles through four different digital values, changing between those values at a rate defined by the clock signal provided as input to that shift register.

It may be appreciated that any digital values can be preloaded into the shift register, or more precisely, a memory structure feeding the shift register. The preloaded digital values need not be numerically sequential, need not be limited to four bits, and may be defined at least in part by software. More generally, it is appreciated that a shift register as described herein can be implemented to output any suitable set or sequence of numbers at a rate defined by a clock signal output from a phase-locked loop, such as described herein.

The sequence of digital values output from the shift register is provided as input to a digital to analog converter. In many embodiments, the analog to digital converter is configured for constant current operation. In these examples, a digital value output from the shift register informs a magnitude of current output from the analog to digital converter.

It may be appreciated that the foregoing described construction (including an oversampled phase-locked loop providing a high-frequency clock signal as input to a shift register configured to output a sequence of digital values to an analog to digital converter that outputs a magnitude of current corresponding to the value output from the shift register) can be leveraged to generate a high-resolution, periodic, current waveform having an arbitrary shape. In addition, it may be appreciated that by leveraging the systems and methods described herein, an arbitrary waveform generator can be manufactured with small form-factor electronic components and may, in certain constructions, be suitable to include within a housing of a portable electronic device.

In particular, "samples" of a desired waveform can be stored as digital values in the memory structure feeding the shift register. These samples can, in turn, be sequentially read out by the shift register at a "sampling rate" or "sampling frequency" equal to the clock signal output from the oversampled phase-locked loop.

As a result, the arbitrary current waveform generator can output an arbitrary current waveform, defined by the sampling frequency and a set of samples preloaded into the shift register. Further, the arbitrary current waveform output from the arbitrary current waveform generator may be in phase with the system clock.

In one example implementation of an arbitrary current waveform generator as described herein, it may be desirable to output a well-formed sinusoidal current waveform precisely in phase with a 1 MHz signal, decimated from a 24 MHz clock signal. For purposes of this example, the desired output sinusoidal wave may also be provided at 24 MHz, such that one period of the wave is exactly in phase with one period of the system clock.

The desired output sine wave can be defined by 10 samples preloaded into the shift register of the arbitrary current waveform generator. As may be appreciated by a person of skill in the art, the 10 samples defining the sinusoidal waveform should be cycled through at a sampling rate of 240 MHz to satisfy the above-stated constraint that the output sinusoidal wave has a frequency of 24 MHz. The desired 240 MHz sampling rate defines that the clock signal supplied to the shift register of the arbitrary current waveform generator should be provided at 240 MHz.

As a result of this constraint, one or more properties of the phase-locked loop can be selected. For example, in one construction, the voltage controlled oscillator can be configured to oversample the decimated system clock by a factor of 480 to output an oversampled clock signal at 480 MHz. This oversampled clock signal can be decimated by a factor of 2 by the first decimator to output a decimated oversampled clock signal at 240 MHz. Thus, the second decimator may be configured to further reduce the 240 MHz clock signal by a factor of 240 so that a feedback clock signal can be provided back to the phase detector of the phase-locked loop. As a result of this construction, a quantized sinusoidal current waveform, in phase with the system clock and having a frequency of 24 MHz, can be output from the arbitrary current waveform generator.

The foregoing example is not exhaustive. For example, and in particular, it may be appreciated that any number of arbitrary samples can be selected to define a particular waveform at any given frequency. In other words, a "resolution" of a current waveform output from an arbitrary current waveform generator as described herein can be tuned on an implementation-specific basis; some embodiments may require a high resolution (e.g., a larger number of samples) waveform, whereas others may not require a high resolution waveform.

More broadly, it may be appreciated that different embodiments can be configured to produce any arbitrary waveforms, to any suitable resolution. In particular, factors that may vary from embodiment to embodiment or waveform to waveform can inform or otherwise influence other factors. For example, in some cases, a sampling frequency may be selected which, in turn, defines a number of samples required to define a waveform as described herein. In other cases, a number of samples may be selected which, in turn, defines the sampling frequency at which those samples should be read out to the digital to analog converter.

Further, it may be appreciated that an arbitrary waveform generator as described herein can be dynamically or statically configured. For example, in some cases, an arbitrary current waveform generator can be configured to dynamically change the first and second factors of the phase-locked loop in order to dynamically adjust the sampling frequency supplied to the shift register. Similarly, it may be appreciated that by modifying digital values stored as samples of a desired waveform, properties of that waveform can be dynamically changed. For example, a direct current bias can be added to each sample of a waveform. In other cases, a phase of the output waveform can be adjusted (e.g., by pre-shifting the shift register to a particular phase offset). Many examples are possible.

Independent of a specific implementation, it may be appreciated that an arbitrary current waveform that can be output at any suitable resolution can be leveraged for a number of purposes and may be particularly suitable for providing more precise control over current-controlled electronic device components or circuits.

A person of skill in the art may readily appreciate that many example electronic circuits, components, or systems can leverage constant current input. For simplicity of description, the embodiments that follow reference an optoelectronic subsystem of an electronic device that includes at least one light-emitting element. The light-emitting element of the optoelectronic system can be a laser, a laser diode, a surface emitting laser (vertical cavity, horizontal cavity, or any other suitable construction), a light-emitting diode, or any combination or array thereof. In such constructions, an arbitrary current waveform generator, as described herein, can be configured to power the light-emitting element(s) with a current waveform output therefrom.

For simplicity, an operation of applying a current waveform to a light-emitting element as described herein can be referred to as "driving" that light-emitting element. Thus, more generally and broadly, an electronic device can include an optoelectronic system (or subsystem) that includes a light-emitting element driven by output of an arbitrary current waveform generator, as described herein.

Example optoelectronic systems include, but are not limited to: proximity sensors; dot projectors; motion/touch sensors; environmental sensors; time-of-flight sensors (either direct or indirect); depth sensors; health sensors; rangefinders; infrared image capture systems; ultraviolet image capture systems; and so on. It is appreciated that these examples are not exhaustive.

Accordingly, for simplicity of description, many embodiments that follow reference an "optical proximity sensor" as one example of an optoelectronic system that can include a light-emitting element, such as described herein. It may be appreciated, however, that this is merely one example and that other optoelectronic systems, system types, and combinations thereof, may be suitably incorporated into an electronic device such as described herein.

In many cases, it may be preferred to modulate output from a light-emitting element of an optical proximity sensor at a particular frequency, or according to a particular pattern. This may be particularly desirable if the optical proximity sensor is implemented as a time-of-flight sensor that is leveraged to measure a distance separating an object nearby the optoelectronic system (also referred to as a depth mapping sensor or, more simply, a depth sensor). A time-of-flight sensor, as described herein, can be a direct time-of-flight sensor or an indirect time-of-flight sensor.

As noted above, an optical proximity sensor can include an arbitrary current waveform generator to drive at least one light-emitting element of the optical proximity sensor. One example of a light-emitting element that can be incorporated into an optical proximity sensor is a vertical cavity surface-emitting laser ("VCSEL"). In many constructions, an optical proximity sensor can include an array of VCSELs that can be configured to be driven simultaneously, but this may not be required of all embodiments. For simplicity of description, many embodiments that follow reference an optical proximity sensor including only a single VCSEL, but it may be appreciated that this is merely one construction.

As may be appreciated, an arbitrary waveform generator as described herein can be leveraged to tightly control output from the VCSEL. More specifically, by specifically configuring the phase-locked loop to output an appropriate sampling frequency and by preloading a set of samples into the shift register, any waveform can be applied to the VCSEL. As may be appreciated by a person of skill in the art, any suitable characteristic of any suitable waveform can be modified in real time to adjust one or more operational parameters of the VCSEL.

For example, as may be appreciated by a person of skill in the art, a VCSEL (much like a diode) may require at least a forward bias voltage before emitting light. In such examples, a waveform stored in a waveform memory (used to prepopulate the memory structure of the shift register) can be modified with a direct current bias. In other words, each value/sample defining a particular waveform can be biased to a slightly higher digital current value. The amount of biasing applied can be variable or may be fixed. For example, in some embodiments, a forward bias voltage of a VCSEL may vary with temperature. In such examples, the quantity of biasing applied to a given waveform can be changed, in real time, based on the temperature of the VCSEL.

In yet other examples, other parameters of a waveform can be adjusted by an arbitrary waveform generator, as described herein. Example parameters include, but are not limited to: phase of the waveform; amplitude of the waveform; number of samples (and, likewise, sampling frequency) defining the waveform; envelope of the waveform; maximum and minimum values of the waveform; and so on. It may be appreciated, more generally and broadly, that a set of samples defining a particular waveform can be modified in any suitable manner to define a custom or real-time waveform that can be used to drive a VCSEL of an optoelectronic system, such as described herein.

In some examples, a processor of an electronic device or a processor associated with the optoelectronic system or a processor associated with the arbitrary waveform generator can be configured to modify one or more parameters of a waveform in real time. In other cases, multiple different variations of a given waveform (e.g., a sine wave) can be stored in a memory and may be accessed at different times in response to different operational conditions. For example, in one embodiment, a sample set defining a sinusoidal waveform can be stored in a memory; the set can be preloaded into a memory structure of the shift register when the sinusoidal waveform is selected to drive a VCSEL. In some examples, a processor can change an amplitude of the sinusoidal waveform by scaling all samples by a selected factor. In other examples, multiple sample sets can be stored, each including a different amplitude.

Once an arbitrary waveform is generated and supplied as input to a current-controlled device, such as a light-emitting element of an optical sensing system as described herein, it may be critical to synchronize that transmitted signal with the receive side.

As noted above, the synchronization operation can be performed by resetting the input decimator of the transmit-side phase-locked loop and the receive-side phase-locked loop. When each of these devices is reset at substantially the same moment, all operations of the respective phase-locked loops are synchronized to within at least jitter of the system clock.

In many cases, the synchronization signal can be tapped from another signal that serves another purpose for the system. For example, as noted above, in many embodiments, output from the light-emitting element may be strobed. More particularly, a strobe signal can enable and disable output from the light-emitting element. When the strobe signal enables the light emitting element, the light emitting element can emit light modulated according to the output of the arbitrary waveform generator described above.

The transmit side of embodiments described herein can also include a delay-locked loop to further facilitate high-precision synchronization between the transmit side and the receive side. The delay-locked loop can include one or more delay lines which, in turn, can include one or more programmable or voltage-controlled delay blocks.

In an example configuration, current output from the arbitrary waveform generator is supplied as input to a first delay line. An output of the first delay line is provided as input to the light-emitting element. By controlling the delay imparted by the first delay line, the light output from the light-emitting element can be synchronized precisely with the operation of the receiver and, thus, the receive side can more precisely determine phase difference between transmitted light and received light.

In many embodiments, a second delay line may also be included. The second delay line can receive, as input, the current waveform output from the arbitrary waveform generator. The second delay line can be loaded by a dummy load that is electrically configured to emulate the input impedance (and/or other electrical properties) of the light-emitting element.

In this construction, the first and second delay lines can be synchronized together in a first delay-locked loop. The delay-locked loop can receive as a first input to a phase detector an output of a voltage controlled delay block of the first delay line and to receive as a second input to the phase detector an output of a second voltage-controlled delay block of the second delay line. The phase detector can output a voltage that can be received as input back to each voltage-controlled delay block. In this manner, the delays imparted by the first and second delay lines can be precisely synchronized.

In other examples, each of the first delay line and the second delay line can include programmable voltage controlled delays. As with the previous example, outputs from the programmable voltage delay blocks can be supplied as input to another phase detector that, in turn, can provide a control voltage back to each programmable delay block.

More simply, embodiments described herein can include two delay lines that are defined by two serially-coupled delay-locked loops. At least one delay module in each delay line is programmable so that environmental or thermal calibration operations can be readily performed.

These delay lines cooperate to maintain a precise delay that can be tuned to specifically match a fixed delay between the receive side and the transmit side (e.g., due to trace length, thermal changes, and so on).

The foregoing example embodiments are not exhaustive of the various potential uses of an arbitrary current waveform generator as described herein. More broadly, these foregoing and other embodiments are discussed below with reference to FIGS. 1-7. However, those skilled in the art will readily appreciate that the detailed description given herein with respect to these figures is for explanation only and should not be construed as limiting.

FIG. 1 depicts a schematic representation 100 of an electronic device 102, including a housing that encloses a stack of multiple layers, referred to as a "display stack", that cooperates to define a digital display configured to render visual content to convey information to, to solicit touch or force input from, and/or to provide entertainment to a user of the electronic device 100. The display stack can include layers or elements such as, in no particular order: a touch input layer; a force input layer; a haptic output layer; a thin-film transistor layer; an anode layer; a cathode layer; an organic layer; an encapsulation layer; a reflector layer; a stiffening layer; an injection layer; a transport layer; a polarizer layer; an anti-reflective layer; a liquid crystal layer; a backlight layer; one or more adhesive layers; a compressible layer; an ink layer; a mask layer; and so on.

For simplicity of description, the embodiments that follow reference a display stack implanted with an organic light emitting diode display technology and can include, among other layers: a reflective backing layer; a thin-film transistor layer; an encapsulation layer; and an emitting layer. It is appreciated, however, that this is merely one illustrative example implementation and that other displays and display stacks can be implemented with other display technologies, or combinations thereof. An example of another display technology that can be used with display stacks and/or displays such as described herein is a micro light emitting diode display.

The display stack also typically includes an input sensor (such as a force input sensor and/or a touch input sensor) to detect one or more characteristics of a user's physical interaction with an active display area defined by the display stack of the display of the electronic device 100.

The active display area is typically characterized by an arrangement of individually-controllable, physically-separated, and addressable pixels or subpixels distributed at one or more pixel densities and in one or more pixel or subpixel distribution patterns. In a more general phrasing, the active display area is typically characterized by an arrangement of individually-addressable discrete light-emitting regions or areas that are physically separated from adjacent or other nearby light-emitting regions.

In many embodiments, the light-emitting regions defining the active display area are disposed onto, or formed onto, a transparent substrate that may be flexible or rigid. Example materials that can form a transparent substrate, such as described herein can include polyethylene terephthalate and/or glass. In other cases, a partially opaque substrate can be used; in such embodiments, at least a portion of the substrate between the pixels defined thereon may be partially or entirely optically transparent.

In addition, example input characteristics that can be detected by an input sensor of the electronic device 102—which can be disposed above or below a display stack, or, in other cases, can be integrated with a display stack—can include, but are not limited to: touch location; force input location; touch gesture path, length, duration, and/or shape; force gesture path, length, duration, and/or shape; magnitude of force input; number of simultaneous force inputs; number of simultaneous touch inputs; and so on.

As a result of these constructions, a user of the electronic device 100 may be encouraged to interact with content shown in the active display area of the display by physically touching and/or applying a force with the user's finger to the input surface above an arbitrary or specific region of the active display area.

In addition, the electronic device 102 includes an optoelectronic system integrating an optical proximity sensor 104 that includes a light-emitting element and a photosensitive element. The optoelectronic system can be disposed behind the display stack (and/or behind the active display area of the display stack) or it can be positioned behind an aperture or other imaging window defined through a bezel region circumscribing the active display area. In some embodiments, multiple optical sensing apertures with different shapes are separated and supported by an opaque and light absorbing backing layer or an additional optical/mechanical structure.

In particular, as noted with respect to other embodiments described herein, the optical proximity sensor 104 may be configured to emit light through the optical sensing aperture and to receive light from the optical sensing aperture. The light emitted and received by the optical sensing system may be used to detect the presence and/or proximity and/or range of an object 106, which may be a user of the electronic device 102.

In these constructions, the light-emitting element can be operationally and conductively coupled to an arbitrary waveform generator and a delay-locked loop, such as described herein.

Generally and broadly, as noted above, the optical proximity sensor 104 can be configured to drive the light-emitting element to produce strobed modulated light and can likewise be configured to obtain a signal from the photosensitive element that may correspond to a reflection of the light emitted from the light-emitting element.

By comparing a phase of light emitted from the optical proximity sensor 104 to a phase of light received by the photosensitive element, the optical proximity sensor 104 can determine distance between the electronic device 100 and an object 106 interrupting, and reflecting, light emitted by the light-emitting element. As may be appreciated by a person of skill in the art, determining phase differences between a transmitted signal and a received signal, each having a high frequency, may be accomplished only if the receive side and transmit side are precisely synchronized, such as described herein.

In many constructions, the optoelectronic system of the electronic device 102 includes a protective enclosure (or, more simply, an "enclosure"), potting, or encapsulation to prevent damage to parts and components thereof. The protective component enclosure of the optoelectronic system is typically affixed to an internal surface or structure within a housing of the electronic device 102, such as a frame.

The protective component enclosure of the optoelectronic system of the electronic device 102 can include a barrel portion extending a distance at least partially into and/or out from a body portion. The barrel typically can have a rounded cross section although this is not required and other shapes may be suitable. The barrel can be leveraged to enclose and protect a set of optical elements configured to cooperate to focus and/or stabilize an image onto a focal plane of a photosensitive element disposed within the body portion of the protective component enclosure of the optoelectronic system.

In some cases, the barrel of the optoelectronic system may extend through an aperture defined through the housing of the electronic device 100, such as shown in FIG. 1. In other cases, the barrel of the optoelectronic system may be disposed entirely within the housing, positioned below and aligned with an optically transparent window. In such examples, the optically transparent window is typically formed from a durable and/or tough material such as glass or sapphire and may, in many examples, form at least a portion of a continuous exterior surface of the housing of the electronic device 102.

In some constructions, the barrel of the optoelectronic system includes a front element that protects and encloses one or more lens groups, optical image stabilization lenses, filters, apertures, and so on each of which may be disposed, in implementation-specific positions and order, above an image sensor or photosensitive element (e.g., photosensitive element) of the optoelectronic system.

In some implementations, an infrared cut filter can be positioned over the photosensitive element, below the barrel of the optoelectronic system, to prevent infrared light from interfering with imaging operations of the photosensitive element by reflecting substantially all infrared light away from the photosensitive element. In other cases, other optical filters can be used such as color filters, polarization filters, ultraviolet filters, and so on, each type of which is specifically configured to be transparent to a first spectral range of light and to be reflective to a second spectral range of light.

In view of the foregoing, it may be appreciated that the example structure(s) and component(s) of the optoelectronic system referenced above is not exhaustive. An optoelectronic system incorporated into an example electronic device, such as the electronic device 102, can include any number of suitable electrical, mechanical, optical, and structural components, the configuration(s), placement(s), and arrangement(s) of which may vary from embodiment to embodiment, implementation to implementation, and electronic device to electronic device.

Similarly, it may be appreciated that an optoelectronic system may be disposed relative to any suitable surface of an electronic device. Examples include: an optoelectronic system disposed relative to a perimeter or periphery of a display and/or user input surface; an optoelectronic system disposed relative to a rear surface of a housing opposite a display and/or user input surface; an optoelectronic system disposed relative to a sidewall or edge surface of an electronic device housing; an optoelectronic system disposed behind and/or within an active display area of a display and oriented to collect light incident to the display; and so on.

The light-emitting element of the optical proximity sensor 104 can include one or more VCSEL light sources. The VCSEL light sources of the optical proximity sensor 104 can be formed from any number of suitable materials or combinations of materials. Similarly, the VCSEL light sources of the optical proximity sensor 104 can be formed in a suitable pattern or array. In one example embodiment, the VCSEL light sources of the optical proximity sensor 104 each include, without limitation or requirement: a first distributed Bragg reflector layer; an oxide layer defining an emission aperture; a quantum well layer; a second distributed Bragg reflector layer; and so on. In other examples, additional or fewer layers may be required.

As noted above, the VCSEL light sources of the optical proximity sensor 104 can be configured to emit beam(s) of light that exit the optoelectronic system to propagate into free space. If an object, such as the object 106, is present to interrupt the propagation of those beams, some laser light will be reflected from an external surface of that object back toward the optoelectronic system.

Thereafter, as noted above, at least a portion of the reflected laser light reenters the barrel of the optoelectronic system, traverses the one or more lenses in the barrel, and is absorbed by the photosensitive element of the optical proximity sensor. One or more properties of the received light, if any, can be characterized by monitoring (e.g., via a processor or circuit within, or external to, the optoelectronic system or the optical proximity sensor 104) current through, or voltage across, the photosensitive element. An output from the photosensitive element can, thereafter, be used to determine a measured distance, velocity, and/or acceleration of the object 106 relative to the electronic device 102 that, in turn, can be communicated to another processor or system of the electronic device 102.

More specifically, the optical proximity sensor 104 can be configured to communicate distance and/or velocity information to a processor or system of the electronic device 102 in any suitable manner, according to any protocol, and/or in compliance with any suitable digital or analog form or format. In response, the electronic device 102 may be configured to perform a function upon determining that the measured distance (and/or velocity, acceleration, and so on) has crossed one or more thresholds, such as distance thresholds or velocity thresholds. Such thresholds may be variable or fixed and may be set by, and/or stored within, a memory of the electronic device 102.

In some examples, the thresholds may be based on a user setting, an application setting, or an operating system setting or mode of operation. In other cases, such thresholds may be based, at least in part, on a particular application executed by operation of, or instantiated by, a processor of the electronic device 102. For example, a threshold set associated with a telephony application may be different from a threshold set associated with a gaming application. It may be appreciated that any suitable threshold or set of thresholds, stored or accessed in any suitable form or format, may be used to inform one or more behaviors of the electronic device 102 in response to a signal received from the optical proximity sensor 104.

In another embodiment, the electronic device 102 can modify a display or power setting of the electronic device 102 based on the distance and velocity of the object (which may be a user of the electronic device 102). Examples include, but may not be limited to: decreasing a brightness of a display or a display region upon receiving a signal from the optical proximity sensor 104 that the user is covering the display; increasing a brightness of a display upon receiving a signal from the optical proximity sensor 104 that the display is uncovered; highlighting a user interface element (e.g., an item of a list, a button, and the like) of a graphical user interface upon receiving a signal from the optical proximity sensor 104 that the user is hovering a finger nearby the display; highlighting or otherwise modifying a user interface element of a graphical user interface upon receiving a signal from the optical proximity sensor 104 that the user is hovering a finger nearby an input component of the electronic device 102 (e.g., rotary input device, push-button input device, touch input device, and so on); and so on.

In another embodiment, the electronic device 102 may be a portable electronic device such as a cellular phone. In these examples, the electronic device 102 can leverage velocity or distance information received from the optical proximity sensor 104 integrated into the optoelectronic system to determine an appropriate time to disable or enable a touch-sensitive display of the electronic device 102 when a user of the electronic device raises or lowers the cellular phone relative to the user's ear.

In other embodiments, the electronic device 100 can consume information from the optical proximity sensor 104 to inform an image or video capture operation of the optoelectronic system incorporating the optical proximity sensor 104 such as, but not limited to: an autofocus operation; a rangefinding operation; a field of view scanning operation; an optical image stabilization operation; an object tracking operation; a focus following operation; and so on or any combination thereof.

In other cases, the optical proximity sensor 104 can be configured to determine a depth map of a field of view of the optical proximity sensor. In such examples, the optical proximity sensor may be referred to as a rangefinding sensor, a depth sensor, a biometric sensor (e.g., face mapping sensor), and so on.

Independent of configuration, the optical proximity sensor 104 may be configured to leverage an arbitrary waveform generator, such as described herein, to tune and adjust output of the VCSEL light source(s) to improve performance of the optical proximity sensor 104.

For example, as noted above, light output from a light-emitting element may be modulated in certain embodiments to improve performance. In conventional optical proximity sensors, a square wave would be applied to the light-emitting element in order to modulate light output from that element at a particular selected frequency, the center frequency of the square wave itself. However, as known to a person of skill in the art, a square wave includes substantial harmonic frequency content relative to a sine wave of the same frequency. In some implementations of an optical proximity sensor, the high frequency content generated as a result of applying a square wave to the light-emitting element may reduce performance of the optical proximity sensor.

By contrast, embodiments described herein can leverage an arbitrary waveform generator as described herein to drive a light-emitting element with a sine wave. The resolution of the sine wave can be defined, as noted above, by the number of samples cycled through the shift register.

Similarly, a waveform generator as described herein can be configured to generate the sine wave used to drive the VCSEL light sources at any suitable phase, at any suitable amplitude, at any suitable frequency or period, and so on.

These foregoing embodiments depicted in FIG. 1 and the various alternatives thereof and variations thereto are presented, generally, for purposes of explanation, and to facilitate an understanding of various configurations and constructions of a system, such as described herein. However, it will be apparent to one skilled in the art that some of the specific details presented herein may not be required in order to practice a particular described embodiment, or an equivalent thereof.

Thus, it is understood that the foregoing and following descriptions of specific embodiments are presented for the limited purposes of illustration and description. These descriptions are not targeted to be exhaustive or to limit the disclosure to the precise forms recited herein. To the contrary, it will be apparent to one of ordinary skill in the art that many modifications and variations are possible in view of the above teachings.

In particular, it may be appreciated that the example electronic device of FIG. 1 is merely one example electronic device that can include an optoelectronic system as described herein which, in turn, can incorporate a waveform generator as described herein.

For example, FIG. 1 depicts an electronic device as a cellular or handheld phone. As may be appreciated by a person of skill in the art, a number of electronic devices—whether stationary or portable—can include an optoelectronic system as described herein. More generally and broadly, an optoelectronic system and/or a waveform generator as described herein can be included or incorporated into, or otherwise leveraged by, any suitable computing resource.

As used herein, the term "computing resource" (along with other similar terms and phrases, including, but not limited to, "computing device" and "computing network") refers to any physical and/or virtual electronic device or machine component, or set or group of interconnected and/or communicably coupled physical and/or virtual electronic devices or machine components, suitable to execute or cause to be executed one or more arithmetic or logical operations on digital data.

Example computing resources contemplated herein include, but are not limited to: single or multi-core processors; single or multi-thread processors; purpose-configured co-processors (e.g., graphics processing units, motion processing units, sensor processing units, and the like); volatile or non-volatile memory; application-specific integrated circuits; field-programmable gate arrays; input/output devices and systems and components thereof (e.g., keyboards, mice, trackpads, generic human interface devices, video cameras, microphones, speakers, and the like); networking appliances and systems and components thereof (e.g., routers, switches, firewalls, packet shapers, content filters, network interface controllers or cards, access points, modems, and the like); embedded devices and systems and components thereof (e.g., system(s)-on-chip, Internet-of-Things devices, and the like); industrial control or automation devices and systems and components thereof (e.g., programmable logic controllers, programmable relays, supervisory control and data acquisition controllers, discrete controllers, and the like); vehicle or aeronautical control devices systems and components thereof (e.g., navigation devices, safety devices or controllers, security devices, and the like); corporate or business infrastructure devices or appliances (e.g., private branch exchange devices, voice-over internet protocol hosts and controllers, end-user terminals, and the like); personal electronic devices and systems and components thereof (e.g., cellular phones, tablet computers, desktop computers, laptop computers, wearable devices); personal electronic devices and accessories thereof (e.g., peripheral input devices, wearable devices, implantable devices, medical devices and so on); and so on. It may be appreciated that the foregoing examples are not exhaustive.

As one example, a waveform generator as described herein can be associated with or included in bench hardware for electronics development, can be included in optical communications systems (e.g., either free space communications systems or fiber optic communications systems), can be included in optical imaging systems, and so on.

A person of skill in the art may appreciate that a waveform generator may be leveraged as an electronic component or member of another, larger, circuit or system; many configurations and use cases are possible.

In some embodiments, a waveform generator can be configured to communicably couple to a processor of an electronic device, such as the cellular phone depicted in FIG. 1. As described herein, the term "processor" refers to any software and/or hardware-implemented data processing device or circuit physically and/or structurally configured to instantiate one or more classes or objects that are purpose-configured to perform specific transformations of data including operations represented as code and/or instructions included in a program that can be stored within, and accessed from, a memory. This term is meant to encompass a single processor or processing unit, multiple processors, multiple processing units, analog or digital circuits, or other suitably configured computing element or combination of elements.

In particular, the processor can be configured to execute an instance of software configured to interface with the waveform generator or delay-locked loop. The software may be executed at an application layer, an operating system layer, a firmware layer, or any other suitable layer. The processor can, in some constructions, be configured to access a memory communicably coupled to the processor to obtain one or more executable binary files or other executable files, collectively referred to as "assets."

Upon obtaining such assets, the processor may be configured to load at least a portion thereof into a working memory, thereby instantiating an instance of the software application. The software application can, thereafter, communicably interface with the waveform generator to inform and/or control one or more operations thereof. For example, the software application can be configured to, without limitation: select a waveform for the waveform generator to generate; select a property of a waveform for the waveform generator to generate (e.g., amplitude, phase offset, frequency, direct current bias, sampling rate, and so on); select a series of waveforms to generate in a sequence; calibrate an output of the waveform generator based on a sensor, such as a temperature sensor; and so on.

In other cases, a waveform generator can include a dedicated processor and/or memory configured to perform one or more functions described above.

Figure 2:
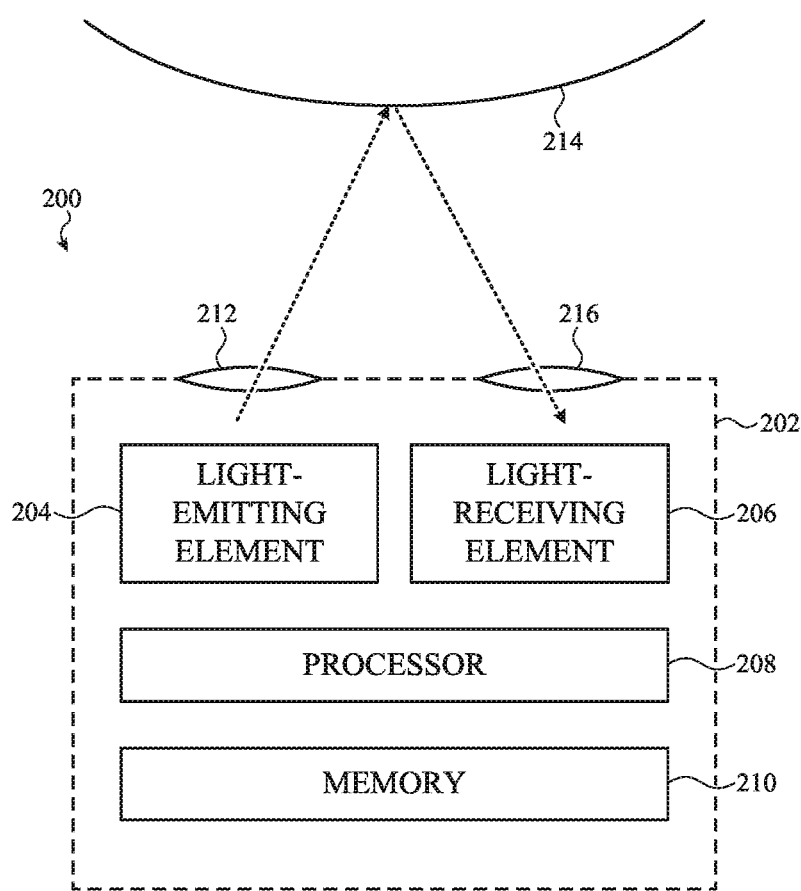
FIG. 2 depicts a simplified system diagram of an electronic device that can include a current-controlled element, such as described herein.

FIG. 2 depicts a simplified signal diagram of an electronic device that can include a current-controlled element, such as described herein. The electronic device 200 can be any suitable electronic device and may be stationary or portable. The electronic device includes a housing 202 that encloses, and supports, one or more components or elements that cooperate to define one or more operations of the electronic device 200.

For example, the housing 202 can define an internal volume into which a light-emitting element 204 and a light-receiving element 206 can be disposed. The light-emitting element 204 may be any light-emitting element, such as described above (e.g., VCSEL, light-emitting diode, and so on). The light-receiving element 206 can be any suitable photosensitive element, such as a photodiode.

The light-emitting element 204 can receive a regulated current signal, or a current waveform, from a waveform generator that may be precisely delayed by a delay-locked loop, such as described herein. Similarly, the photosensitive element 204 can be controlled by an oversampled phase-locked loop, such as described above.

Operations of the waveform generator, the oversampled phase-locked loop(s), and/or the delay-locked loop can be controlled, monitored, or otherwise influenced by a processor 208, in turn coupled to a memory 210.

As with other embodiments described herein, the waveform generator can include, such as described above, an oversampled phase-locked loop, a shift register, a memory coupled to the shift register, and a digital to analog current converter. The waveform generator can receive a system clock signal, decimate that signal to a low-frequency input clock, oversample the decimated input clock signal, optionally down-sample (decimate) the oversampled signal to generate a sampling frequency, leverage the sampling frequency to cycle through a series of digital values that correspond to samples of a desired output current waveform provided as input to the digital to analog converter output from which, in turn, can be provided as input to a delay-locked loop as described herein. The output from the delay-locked loop can be supplied to provide current output to the light-emitting element 204.

Light output from the light-emitting element 204 can pass through one or more optional optical elements 212 (e.g., lenses, filters, reflectors and so on) prior to interruption by an object 214. Similarly, light reflected from the object 214 can be received through one or more optional optical elements 216 prior to being focused onto and absorbed by the light-receiving element 206.

These foregoing embodiments depicted in FIGS. 1-2 and the various alternatives thereof and variations thereto are presented, generally, for purposes of explanation, and to facilitate an understanding of various configurations and constructions of a system, such as described herein. However, it will be apparent to one skilled in the art that some of the specific details presented herein may not be required in order to practice a particular described embodiment, or an equivalent thereof.

Thus, it is understood that the foregoing and following descriptions of specific embodiments are presented for the limited purposes of illustration and description. These descriptions are not targeted to be exhaustive or to limit the disclosure to the precise forms recited herein. To the contrary, it will be apparent to one of ordinary skill in the art that many modifications and variations are possible in view of the above teachings.

Figure 3:
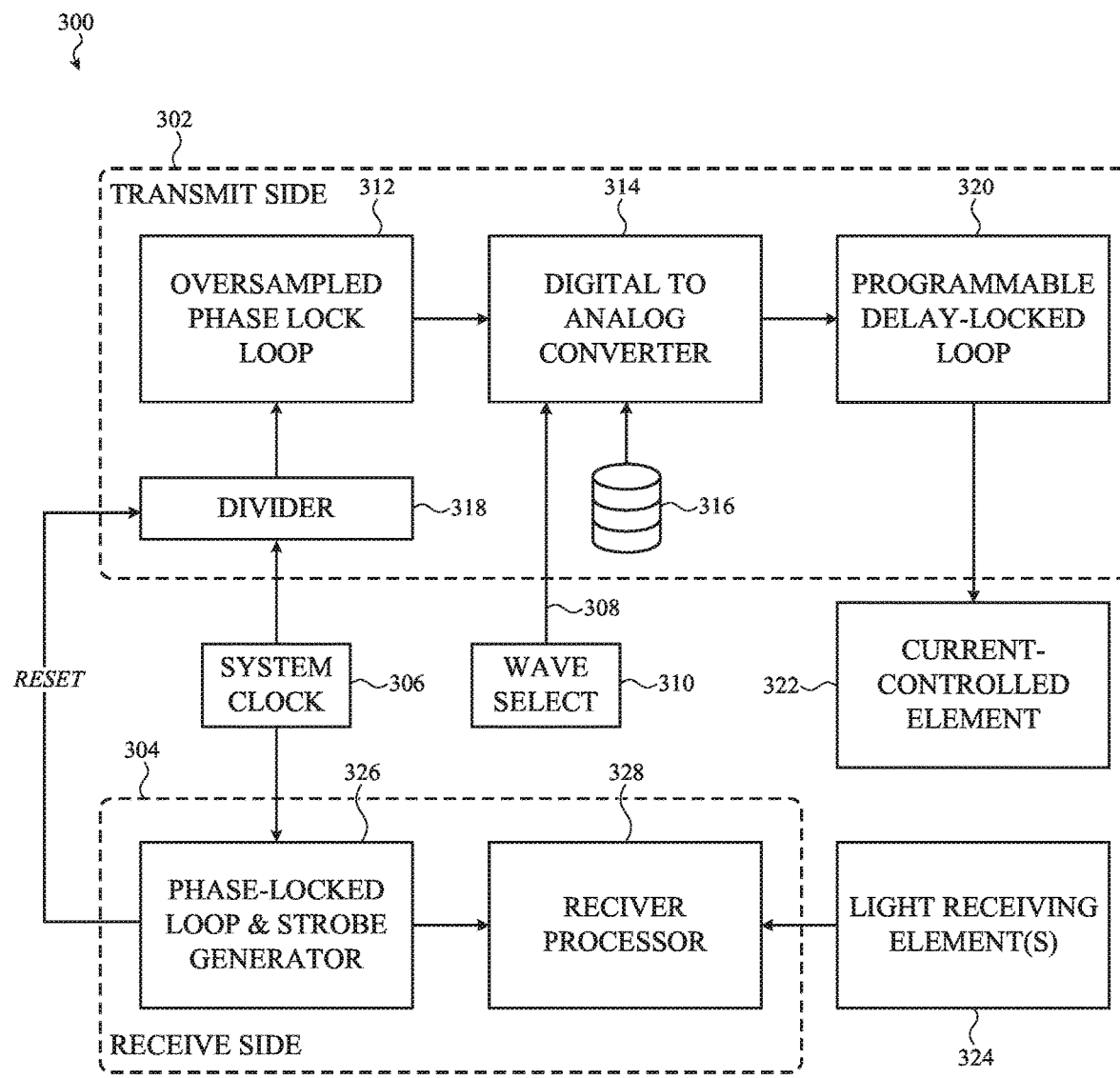
FIG. 3 is a system diagram of an optoelectronic system, such as described herein.

FIG. 3 is a system diagram of an optoelectronic system 300, such as described herein. As with other embodiments described herein, the optoelectronic system 300 includes a transmit side 302 and a receive side 304. The transmit side 302 is synchronized with the receive side 304 and is configured to provide a current waveform (of any arbitrary shape) that may be precisely delayed by a programmable delay-locked loop, described in greater detail below. Output from the programmable delay-locked loop can be supplied as input to a current-controlled element, such as a light-emitting element (e.g., VCSEL).

In many embodiments the transmit side 302 of the optoelectronic system 300 can receive one or more inputs from other systems or processors. In particular, an embodiment in which the transmit side 302 of the optoelectronic system 300 receives two inputs is depicted.

In particular, a first input can be configured to receive a system clock signal (LFREF) (FIG. 4) from a system clock 306 and a second input can be configured to receive a signal 308 comprising a selection of a waveform for the transmit side 302 of the optoelectronic system 300 to generate and provide as modulated optical output. Example waveforms include a sinusoidal waveform, a triangle waveform, a chirp, or any other suitable periodic or aperiodic waveform. It may be appreciated that the source of the signal 308 may be any suitable processor, process, memory, or electronic component. Collectively, example components that may provide the signal 308 are identified in the figure as the waveform select 310 element.

The transmit side 302 of the optoelectronic system 300 also includes an oversampled phase-locked loop 312. The oversampled phase-locked loop 312 is configured to receive a system clock signal from the system clock 306 via the first input. The system clock 306 may provide the system clock signal at any suitable clock frequency. As one example, a system clock frequency may be 24 MHz.

The oversampled phase-locked loop 312 includes many submodules or signal processing stages not shown in FIG. 3. In particular, as noted with respect to other embodiments described herein, the oversampled phase-locked loop 312 can include a phase follower or phase detector. The phase detector of the oversampled phase-locked loop 312 can be configured to output a control voltage that corresponds to a phase difference between the system clock 306 and a feedback clock signal, described in greater detail below.

A control voltage output from the phase detector of the oversampled phase-locked loop 312 can be supplied as input to a voltage controlled oscillator. The voltage controlled oscillator of the oversampled phase-locked loop 312 can be implemented in any suitable manner, but is typically configured to oscillate or resonate at a frequency greater than the system clock signal output by the system clock 306, by an oversampling factor. The oversampling factor may be fixed or variable, and may be selected at least in part based on, and/or may be directly related to, one or more other parameters or operational conditions of the oversampled phase-locked loop 312 itself.

Output from the voltage controlled oscillator can be referred to as an "oversampled clock signal." The oversampled clock signal (HFSAMP) can be provided as input to a first frequency divider, also referred to as a first decimator. The first decimator may be configured to reduce the frequency of the oversampled clock signal by a first decimation factor to produce a first decimated oversampled clock signal.

The oversampled phase-locked loop 312 can further include a second frequency divider, which may be referred to as a second decimator. The second decimator, like the first decimator, may be configured to reduce the frequency of the first decimated oversampled clock signal by a second decimation factor to produce a second decimated oversampled clock signal.

In these constructions, the oversampling factor, the first decimation factor, and the second decimation factor may be strictly interrelated. In particular, a product of the first decimation factor and the second decimation factor equals the oversampling factor.

As a result of this relationship between the various frequency-changing factors leveraged by the oversampled phase-locked loop 312, the second decimated oversampled clock signal can have a frequency equal to the system clock signal output by the system clock 306 and, as a result, the second decimated oversampled clock signal can be provided as feedback input ($LF_{FB}$) to the oversampled phase-locked loop 312. As a result, as may be appreciated by a person of skill in the art, the oversampled phase-locked loop 312 can operate in phase with the system clock 306.

The oversampled phase-locked loop 312 can be configured to provide an output. In particular, in some embodiments, the output provided by the oversampled phase-locked loop 312 can be a tap of the first decimated oversampled clock frequency. In other words, output of the first decimator can be tapped and provided as output of the oversampled phase-locked loop 312. In other embodiments, the output provided by the oversampled phase-locked loop 312 can be a tap of the oversampled clock signal, identified in FIG. 4 as $HF_{SAMP}$.

As noted above, the output of the oversampled phase-locked loop 312 can be referred to herein as the "sampling clock signal" or the "sampling rate."

The sampling clock signal can thereafter be provided to a digital to analog converter 314. The digital to analog converter 314 can be configured to access a set of samples corresponding to a particular waveform selected via signaling across the second input. In many embodiments, the digital to analog converter 314 is configured to access a memory 316 which can store sets of samples associated with one or more waveforms.

Each set of samples includes a series of digital values that correspond to samples of a quantized analog current waveform. The amount of quantization depends upon the number of samples in a given set. As may be appreciated by a person of skill in the art, the Nyquist sampling rate associated with a particular selected waveform's frequency may inform a minimum quantity of samples. In other cases, a greater number of samples may be used.

As a result of this configuration, the digital to analog converter 314 can be configured to cycle through each sample of a selected set of samples at the sampling rate defined by the output of the oversampled phase-locked loop 312. Each digital value supplied as input to the digital to analog converter 314 can be used to define an amount of output current to provide as output from the digital to analog converter 314.

In this manner, and as a result of the foregoing described construction, the optoelectronic system 300 can generate any suitable current waveform, having any suitable properties or shape, in order to drive any suitable current-controlled element in a particular and specified manner.

An example of operation of the optoelectronic system 300 is provided. In this example, a 12 MHz system clock is provided as input to the first input of the oversampled phase-locked loop 312. A signal 308 is provided to the second input of the oversampled phase-locked loop 312 identifying a particular waveform. For purposes of illustration and description, a sinusoidal wave is described as an example waveform.

In this example, the sinusoidal wave may have a specified frequency of 120 MHz, or ten times the system clock. To ensure a smooth reproduction of the 120 MHz sinusoidal wave, the optoelectronic system 300 may determine that ten samples per period of the selected wave should be used. Once this determination is made, the memory 316 may be accessed to obtain a sample set corresponding to the desired frequency and the desired sampling rate. In other cases, a processor or other component may be configured to generate, in real time, a set of values corresponding to a 10-sample sinusoidal wave.

As a result of this determination, the optoelectronic system 300 may further determine that a sampling rate of 1.2 GHz samples per second is required. This requirement defines the output of the first decimator of the oversampled phase-locked loop 312. In other words, the oversampled phase-locked loop 312 may determine that because a 1.2 GHz decimated oversampled clock signal is required, the oversampled clock signal should be at least greater than or equal to 1.2 GHz, such as 2.4 GHz.

In one example, the oversampled clock signal may be 4.8 GHz, or four times the desired first decimated oversampled clock signal. As a result of these foregoing determined operational constraints, the oversampled phase-locked loop 312 may determine that the voltage controlled oscillator should be configured to oscillate at 4.8 GHz, operating at an oversampling factor of 400. The oversampled phase-locked loop 312 may also determine that the first decimator may implement a first decimation factor of 4 so that the sampling frequency is 1.2 GHz. The oversampled phase-locked loop 312 may further determine that the second decimation factor should be 100, meaning that the second decimator is configured to reduce the 1.2 GHz signal to 12 MHz, which in turn can be compared in phase and synchronized to the original system clock signal.

In many embodiments, such as those described above, the transmit side can also include an input decimator 318 configured to initially reduce the system clock signal to a first decimated value. As one example, the input decimator may be configured to reduce the system clock to 1 MHz. As a result of this construction, the oversampling factor and decimation factors of the oversampled phase-locked loop 312 can take a wider range of values and/or may be configured to support a wider range of sampling rates in order to output a wider range or arbitrary current waveforms.

The transmit side 302 of the optoelectronic system 300 also includes a programmable delay-locked loop 320. As noted above, the programmable delay-locked loop 320 is configured to apply a stable delay to the signal output from the digital to analog converter 314 for precise synchronization with the receive side 304.

Delayed current output from the digital to analog converter 314 can be supplied to a current-controlled element, such as a light-emitting element 322. As with other embodiments described herein, the light-emitting element 322 is configured to emit light into a field of view. Some of the light emitted from the light-emitting element 322 may be reflected by an object or surface within the field of view and may be received by a light-receiving element 324 associated with the receive side 304.

The receive side 304 of the optoelectronic system 300 also includes an oversampled phase-locked loop 326. The oversampled phase-locked loop 326 is configured identically to the oversampled phase-locked loop 312 so that the two components can be configured to produce the same frequencies and/or frequency ranges. This description is not repeated.

The oversampled phase-locked loop 326 can also include a strobe generator configured to generate a low-frequency (e.g., KHz scale) strobe signal, such as described above. The duty cycle and/or frequency of the strobe signal may vary from embodiment to embodiment. As noted above, the strobe signal can be used to reset one or more decimators or oversampling elements of the transmit side 302. In many embodiments, the strobe signal generated by the oversampled phase-locked loop 326 is used to reset the input decimator 318 (identified as RESET in FIG. 3).

Output from the oversampled phase-locked loop 326 can be supplied as input to a receive-side processor 328, which in turn can be configured to receive an input from the light-receiving element 324. In this manner, the receive-side processor 328 can be configured to determine a phase difference between light received form the light-receiving element 324 and light emitted by the light-emitting element 322. This phase difference can be correlated to a distance separating the optoelectronic system 300 and an object interrupting light emitted by the light-emitting element 322.

Figure 4:
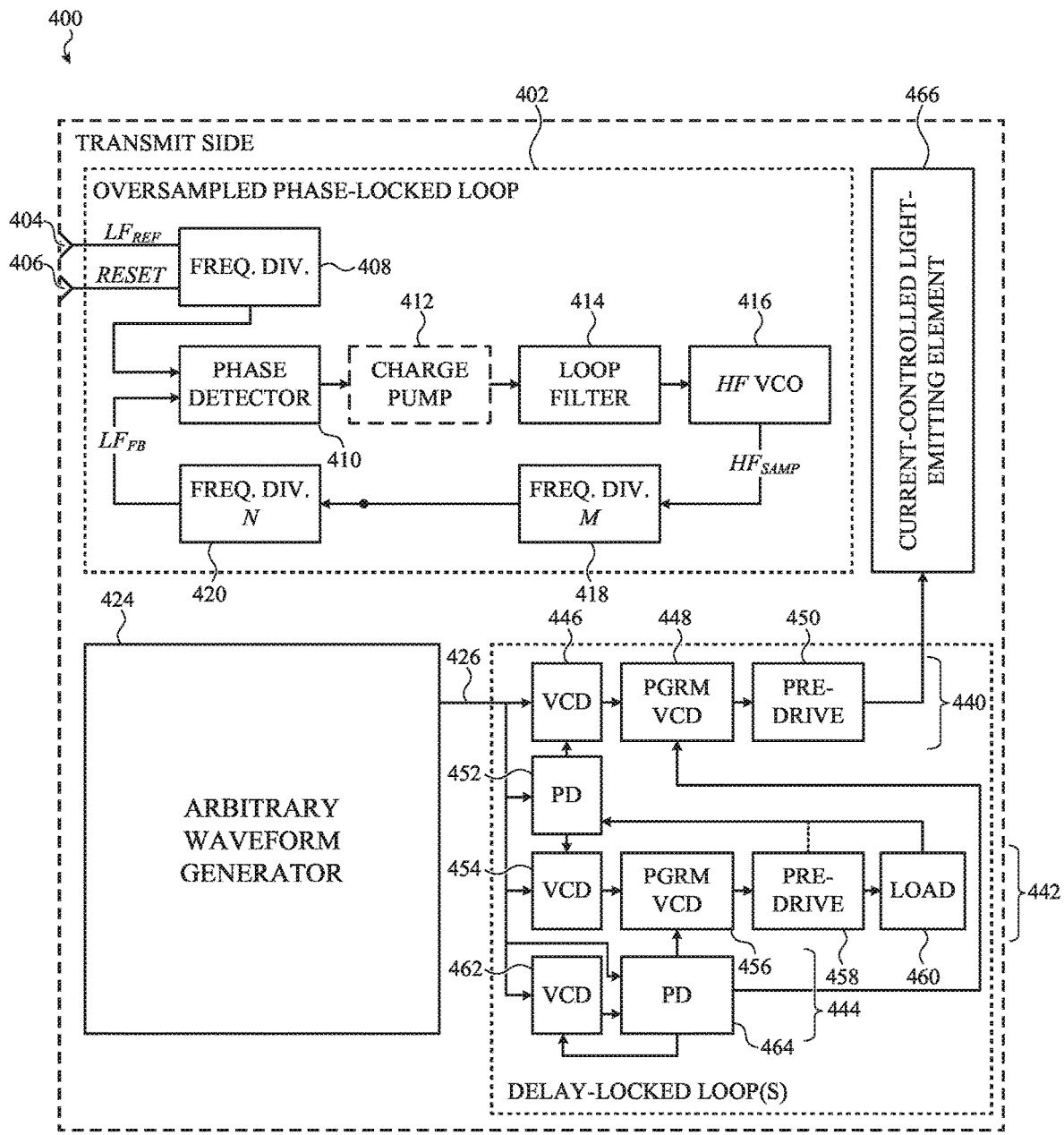
FIG. 4 depicts a signal flow diagram of a transmit side of the optoelectronic system as shown in FIG. 3.

FIG. 4 depicts a signal flow diagram of the transmit side 400 of the optoelectronic system shown in FIG. 3. The transmit side 400 of the optoelectronic system includes an oversampled phase-locked loop block 402.

The oversampled phase-locked loop block 402 is configured to receive a system clock 404 and a reset signal 406 as input. As with other embodiments described herein, the oversampled phase-locked loop block 402 is configured to provide an output that includes a sampling clock signal.

The oversampled phase-locked loop block 402 contains a number of individual signal processing blocks that each perform specific functions. For example, the oversampled phase-locked loop block 402 includes an input decimator 408 (labeled in the figure as a frequency divider) configured to reduce the system clock 404 to a target decimated input frequency. The input decimator 408 is configured to reset its operation in response to a rising edge of the reset signal 406 (which may be a strobe signal received from a receive side, such as described above).

The oversampled phase-locked loop block 402 also includes a phase detector 410. The phase detector 410 is configured with two inputs, a first input to receive an output of the input decimator 408 and a second input to receive a feedback clock signal.

As with other embodiments described herein, the phase detector 410 is configured to provide a voltage output, referred to as the control voltage. The control voltage has a magnitude that corresponds to a phase difference between the feedback clock signal and the system clock 404.

The control signal, in some embodiments, can be amplified by an amplifier. An example amplifier that may be used is a charge pump, such as the optional charge pump 412 of the oversampled phase-locked loop block 402 as shown in FIG. 4.

The oversampled phase-locked loop block 402 can also (optionally) include a filter, referred to a loop filter, shown in the figure as the loop filter 414. The loop filter 414 can be implemented as a low pass filter that removes high frequency content from the control signal output from the phase detector 410.

The loop filter 414 is configured to control or otherwise meter the responsiveness of the oversampled phase-locked loop block 402. In another phrasing, the loop filter 414 may be configured to prevent the oversampled phase-locked loop block 402 from reacting undesirably quickly to changes in phase between the feedback clock signal and the system clock 404.

The oversampled phase-locked loop block 402 can further include a voltage controlled oscillator 416 configured to oscillate at a frequency higher than the system clock 404. A phase of the output of the voltage controlled oscillator 416 can be based on, and determined by, the filtered control voltage output from the loop filter 414.

The voltage controlled oscillator 416 is configured to provide, as output, an oversampled clock signal. The oversampled clock signal has a frequency higher than the system clock 404 by an oversampling factor, such as described above.

The voltage controlled oscillator 416 outputs the oversampled clock signal to a first frequency divider 418 that is configured to reduce the oversampled clock signal by a first decimation factor. The first frequency divider 418 is configured to provide, as output, a first decimated oversampled clock signal.

The first decimated oversampled clock signal has a frequency higher than the system clock 404, but lower than the oversampled system clock output from the voltage controlled oscillator 416. The first decimated oversampled clock signal has a lower frequency than the oversampled clock signal by a first decimation factor.

The first frequency divider 418 outputs the first decimated oversampled clock signal to a second frequency divider 420 that is configured to reduce the first decimated oversampled clock signal by a second decimation factor.

The second frequency divider 420 is configured to provide, as output, a second decimated oversampled clock signal. The second decimated oversampled clock signal has a frequency equal to the output of the input decimator 408 and it may be provided as the feedback signal to the phase detector 410. The second decimated oversampled clock signal has a lower frequency than the first oversampled clock signal by the second decimation factor.

In this manner, as described above, a product of the first decimation factor and the second decimation factor is equal to the oversampling factor.

As with other embodiments described herein, the first decimated oversampled clock signal can be provided, as a sampling clock signal, to the current waveform generator block 424 configured to output an arbitrary current waveform 426, such as described above. It should be appreciated that the exact structure and operation (including internal operation) of the arbitrary waveform generator 424 may vary between embodiments.

In some embodiments, the sampling clock signal, more specifically, can be provided as input to the arbitrary waveform generator 424 and, in some embodiments, to a register of the generator. As may be appreciated by a person of skill in the art, the shift register can be configured to provide a digital output that changes (shifts) in response to each rising edge of each high state of the sampling clock signal.

The arbitrary waveform generator 424 may include a memory or memory structure (collectively identified as the memory) that can store a sequence of values of a set of sequences of values that can be preloaded into the shift register. The set(s) of sequential digital values enqueued to be output by the shift register can be stored in any suitable manner.

In many cases, the arbitrary waveform generator 424 (which is described as outputting a current, but may output a voltage in some embodiments) may provide a constant current output corresponding to a digital value input to the arbitrary waveform generator 424 at a given time. As a result of this construction, the arbitrary waveform generator 424 can be configured to provide a constant current; this current may correspond at any given moment to each sample output by the generator's internal shift register (or other suitable register or shifter).

The transmit side 400 also includes a delay-locked loop block 438. The delay-locked loop block 438 is defined by three delay lines, a primary delay line 440, an auxiliary delay line 442, and a programmable delay line 444.

The primary delay line 440 of the delay-locked loop block 438 includes a voltage controlled delay 446 that introduces a delay between its input and output. The voltage controlled delay 446 is configured to receive the current waveform 426 output from the arbitrary current waveform generator block 424. In another phrasing, the voltage controlled delay 446 introduces a phase shift between its input and its output. The amount of delay introduced by the voltage controlled delay 446 is controlled by an input voltage, described in greater detail below.

The delayed output of the voltage controlled delay 446 is provided as input to another delay block, a programmable voltage controlled delay 448. As with the voltage controlled delay 446, the programmable voltage controlled delay 448 introduces a delay between its input and output. In another phrasing, the programmable voltage controlled delay 448 introduces a phase shift between its input and its output. The amount of delay introduced by the programmable voltage controlled delay 448 is controlled in part by an input voltage and in part by a configuration or parameter of the programmable voltage controlled delay 448.

The (further) delayed output of the programmable voltage controlled delay 448 is provided as input to a pre-drive controller 450 configured to prepare the appropriately-delayed current signal to be applied to a load (e.g., a current-controlled device, such as a light-emitting element).

The primary delay line 440 can be operationally coupled to a phase detector 452. In particular, as noted below, the phase detector 452 can be configured to receive as input two signals and provide as output a single voltage signal that corresponds to a phase difference between those two input signals. In this example embodiment, the phase detector 452 is configured to receive the current waveform 426 as a first input.

As with the primary delay line 440, the auxiliary delay line 442 of the delay-locked loop block 438 includes a voltage controlled delay 454 that introduces a delay between its input and output. In another phrasing, the voltage controlled delay 454 introduces a phase shift between its input and its output. The amount of delay introduced by the voltage controlled delay 454 is controlled by an input voltage.

The delayed output of the voltage controlled delay 454 is provided as input to another delay block, a programmable voltage controlled delay 456. As with the voltage controlled delay 454, the programmable voltage controlled delay 456 introduces a delay between its input and output. In another phrasing, the programmable voltage controlled delay 456 introduces a phase shift between its input and its output. The amount of delay introduced by the programmable voltage controlled delay 456 is controlled in part by an input voltage and in part by a configuration or parameter of the programmable voltage controlled delay 456.

The (further) delayed output of the programmable voltage controlled delay 456 is provided as input to a pre-drive controller 458 configured to prepare the appropriately-delayed current signal to be applied to a dummy load 460. The dummy load 460 can be any suitable collection of electrical components that collectively define a specific input impedance or profile, current loading profile, voltage profile, and so on. In other words, the dummy load 460 can be configured to emulate a current-controlled component, such as a light-emitting element.

Output from the dummy load 460 (or, in some constructions, output from the pre-drive controller 458) can be provided as a second input to the phase detector 452. In this manner, the phase detector 452 can tune a delay to apply to the current waveform 426 (and supply to downstream current-controlled elements) based on inherent delays and electrical characteristics of the delay-locked loop block 438 itself.

As with the primary delay line 440 and the auxiliary delay line 442, the programmable delay line 444 of the delay-locked loop block 438 includes a voltage controlled delay 462 that introduces a delay between its input and output. In another phrasing, the voltage controlled delay 462 introduces a phase shift between its input and its output. The amount of delay introduced by the voltage controlled delay 462 is controlled by an input voltage.

An output of the voltage controlled delay 462 is provided as input to a second phase detector 464 that is configured to receive as input, and compare the phases of the current waveform 426 and the voltage controlled delay 462. In turn, the second phase detector 464 is configured to provide a voltage output that is received as a tuning input to each of the programmable voltage controlled delay 448 and the programmable voltage controlled delay 456.

As a result of the depicted configuration, an arbitrary current waveform can be generated with any suitable resolution, at any suitable frequency, strobed at any suitable duty cycle and/or frequency and delayed by a precise amount to synchronize with a receive side. Once this precisely timed and precisely formed signal is generated, it can be provided as input to a current-controlled light-emitting element, such as the light-emitting element 466.

These foregoing embodiments depicted in FIGS. 3-4 and the various alternatives thereof and variations thereto are presented, generally, for purposes of explanation, and to facilitate an understanding of various configurations and constructions of a system, such as described herein. However, it will be apparent to one skilled in the art that some of the specific details presented herein may not be required in order to practice a particular described embodiment, or an equivalent thereof.

Figure 5A:
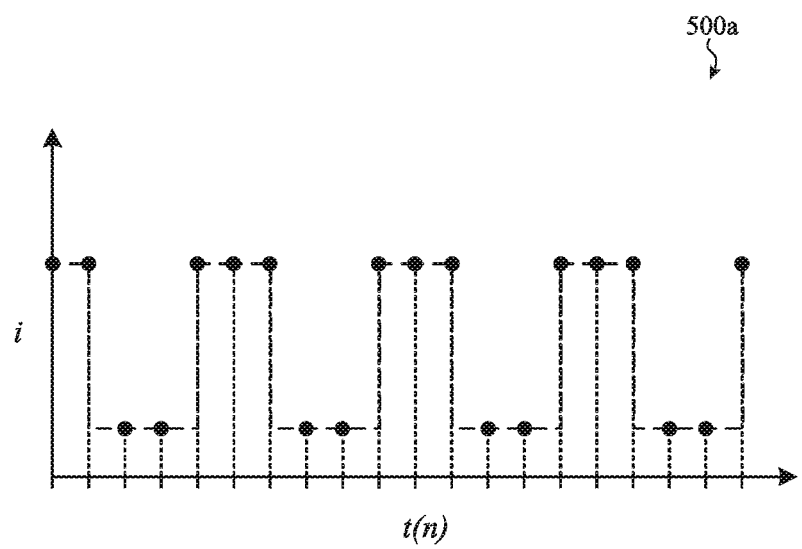
FIGS. 5A-5B depict example arbitrary waveforms that can be generated by an arbitrary current waveform generator, such as described herein.
Figure 5B:
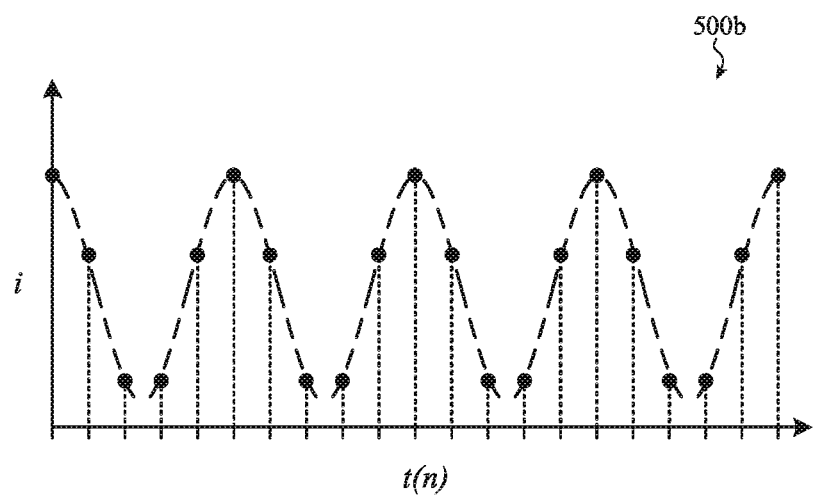

In particular, it may be appreciated that any suitable waveform can be generated by leveraging systems and methods described herein. For example, FIG. 5A depicts a current waveform 500a that corresponds generally to a square wave. Similarly, FIG. 5B depicts a current waveform 500b that corresponds generally to a sine wave.

These foregoing embodiments depicted in FIGS. 3-5B and the various alternatives thereof and variations thereto are presented, generally, for purposes of explanation, and to facilitate an understanding of various configurations and constructions of a system, such as described herein. However, it will be apparent to one skilled in the art that some of the specific details presented herein may not be required in order to practice a particular described embodiment, or an equivalent thereof.

Thus, it is understood that the foregoing and following descriptions of specific embodiments are presented for the limited purposes of illustration and description. These descriptions are not targeted to be exhaustive or to limit the disclosure to the precise forms recited herein. To the contrary, it will be apparent to one of ordinary skill in the art that many modifications and variations are possible in view of the above teachings.

For example, it may be appreciated that a decimator as described herein can be a fractional decimator. In other cases, other phase-locked loop architectures may be used.

Figure 6:
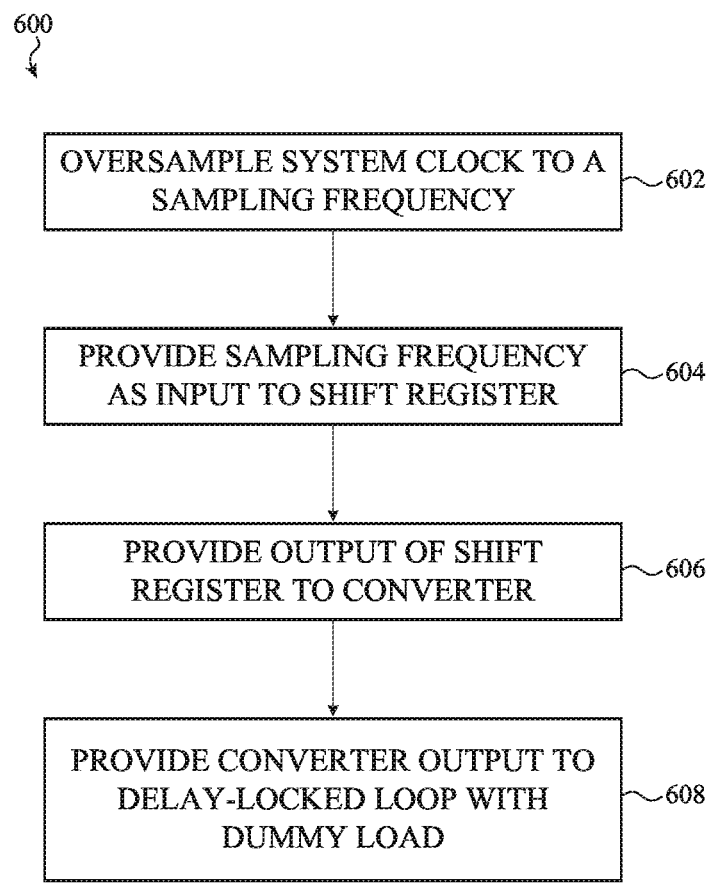
FIG. 6 is a flowchart depicting example operations of a method of generating and delaying a current waveform, such as described herein.
Figure 7:
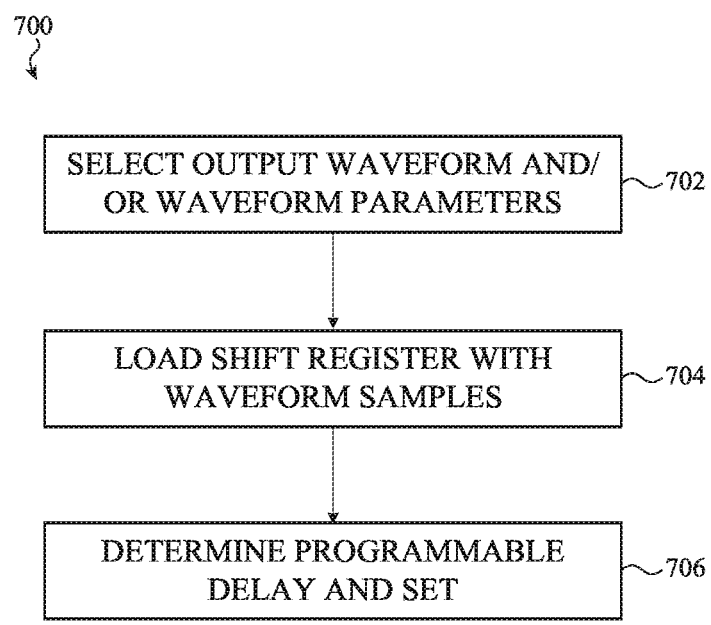
FIG. 7 is a flowchart depicting example operations of a method of calibrating a delay applied to a current waveform, such as described herein.

Generally and broadly, FIGS. 6 and 7 depict flow charts that correspond to example operations of methods associated with the operation of a system as described herein. In particular, FIG. 6 relates to a method of generating a current of a precisely delayed waveform, and FIG. 7 relates to a method of selecting parameters to delay an output of an arbitrary current waveform generator.

These example methods are provided here as examples, but these methods and equivalents thereof are not exhaustive of the various uses or constructions of a transmit (and receive) side of an optoelectronic system, including a phase-locked loop coupled to a delay-locked loop, as described herein.

For example, as noted above, one or more operations of a phase-locked loop coupled to a delay-locked loop, as described herein, can be controlled, informed, or otherwise influenced by a processor of an electronic device incorporating the phase-locked loop coupled to a delay-locked loop. In particular, as noted above, a software application or other instance of software executing as a result of an operation of the processor, and/or otherwise instantiated by the processor, can be configured to generate one or more signals that can be received by any component or module of a phase-locked loop coupled to a delay-locked loop, as described herein.

Independent of a particular selected configuration, it may be appreciated that the methods described in reference to FIGS. 6-7 can be performed by any suitable hardware or software or combination thereof. In some embodiments, a processor can be configured to access a memory to instantiate an instance of software that, when executed by the processor, causes the operations of FIGS. 6-7 to be performed in whole or in part. In other examples, a processor, controller, or other operational electronic component can be configured to perform the operations of FIGS. 6-7 in whole or in part.

FIG. 6 is a flowchart depicting example operations of a method of generating and delaying a current waveform, such as described herein. The method 600 includes operation 602 in which a system clock, and in many cases, a decimated clock signal based on a system clock is received and oversampled to a sampling frequency. Next, at operation 604, the sampling frequency is provided as input to a shift register preloaded with one or more samples of a desired waveform shape. The method 600 advances to operation 606 at which an output of the shift register is provided to a digital to analog converter, such as a current converter. Finally, at operation 608, the converter output is applied as input to a delay-locked loop including at least one dummy load. As described above, the dummy load may be used to calibrate a parallel delay line that serves a current-controlled load, such as a light-emitting element.

FIG. 7 is a flowchart depicting example operations of a method of calibrating a delay applied to a current waveform, such as described herein. The method 700 includes operation 702 at which an output waveform and/or one or more output waveform parameters are determined. Next, at operation 704, a shift register of a waveform generator can be preloaded with one or more values (samples) that correspond to features selected at operation 702. Finally, at operation 706, a programmable delay associated with the waveform, a temperature, a particular field calibration parameter, a factory calibration parameter, or a system or user setting can be applied to a programmable delay line.

As used herein, the phrase "at least one of" preceding a series of items, with the term "and" or "or" to separate any of the items, modifies the list as a whole, rather than each member of the list. The phrase "at least one of" does not require selection of at least one of each item listed; rather, the phrase allows a meaning that includes at a minimum one of any of the items, and/or at a minimum one of any combination of the items, and/or at a minimum one of each of the items. By way of example, the phrases "at least one of A, B, and C" or "at least one of A, B, or C" each refer to only A, only B, or only C; any combination of A, B, and C; and/or one or more of each of A, B, and C. Similarly, it may be appreciated that an order of elements presented for a conjunctive or disjunctive list provided herein should not be construed as limiting the disclosure to only that order provided.

One may appreciate that although many embodiments are disclosed above, that the operations and steps presented with respect to methods and techniques described herein are meant as exemplary and accordingly are not exhaustive. One may further appreciate that alternate step order or fewer or additional operations may be required or desired for particular embodiments.

Although the disclosure above is described in terms of various exemplary embodiments and implementations, it should be understood that the various features, aspects and functionality described in one or more of the individual embodiments are not limited in their applicability to the particular embodiment with which they are described, but instead can be applied, alone or in various combinations, to one or more of the some embodiments of the invention, whether or not such embodiments are described and whether or not such features are presented as being a part of a described embodiment. Thus, the breadth and scope of the present invention should not be limited by any of the above-described exemplary embodiments but is instead defined by the claims herein presented.

What is claimed is:

1. An optoelectronic system for an electronic device, the optoelectronic system comprising:
    a transmit side comprising:
        a phase-locked loop configured to:
            receive, as input, a system clock signal;
            decimate the system clock signal to a decimated input signal;
            oversample the decimated input signal to an oversampled clock signal;
            decimate the oversampled clock signal to a sampling signal; and
            decimate the sampling signal to a frequency of the decimated input signal;
        a shift register configured to receive the sampling signal and, in response, output a sequence of digital values;
        a converter configured to receive the sequence of digital values and to output a current corresponding to each value of the sequence of digital values;
        a delay-locked loop configured to receive current output from the converter and to apply a phase delay thereto; and
        a light-emitting element configured to receive as input output from the delay-locked loop.

2. The optoelectronic system of claim 1, wherein:
    the phase-locked loop is a first phase-locked loop; and
    the optoelectronic system further comprises a receive side comprising a second phase-locked loop and a strobe generator; wherein
    the decimated input signal is configured to reset in response to a strobe signal generated by the strobe generator.

3. The optoelectronic system of claim 1, wherein the phase-locked loop:
    decimates the system clock signal by a first factor;
    oversamples the decimated input signal by a second factor;
    decimates the oversampled clock signal by a third factor; and
    decimates the sampling signal by a fourth factor.

4. The optoelectronic system of claim 3, wherein a product of the second and third factors is a reciprocal of the second factor.

5. The optoelectronic system of claim 1, wherein the decimated input signal has a frequency that is a power of 10.

6. The optoelectronic system of claim 1, wherein the sampling signal is of greater frequency than the system clock signal.

7. The optoelectronic system of claim 1, wherein the delay-locked loop comprises at least two parallel delay lines.

8. The optoelectronic system of claim 7, wherein:
    a first delay line of the delay-locked loop receives as input output from the converter and provides output to the light-emitting element; and
    a second delay line of the delay-locked loop receives as input output from the converter and provides output to a dummy load.

9. The optoelectronic system of claim 8, wherein the dummy load is configured to emulate an electrical property of the light-emitting element.

10. The optoelectronic system of claim 1, wherein the delay-locked loop comprises at least one programmable delay block.

11. The optoelectronic system of claim 1, wherein the converter is a digital to analog current converter.

12. An optoelectronic system for an electronic device, the optoelectronic system comprising:
    a receive side comprising:
        a first phase-locked loop configured to:
            receive, as input, a system clock signal;
            decimate the system clock signal to a first frequency;
            oversample the first frequency to a second frequency;
            decimate the second frequency to a third frequency; and
            decimate the third frequency to the first frequency; and
        a strobe generator configured to generate a pulse output; and
    a transmit side comprising:
        a phase-locked loop configured to:
            receive, as input, the system clock signal;
            decimate the system clock signal to the first frequency, resetting the first frequency in response to the pulse output;
            oversample the first frequency to the second frequency;
            decimate the second frequency to the third frequency; and
            decimate the third frequency to the first frequency;

a waveform generator configured to receive as clock input the third frequency and, in response, output a current waveform;

a delay-locked loop configured to apply a phase delay to the current waveform; and a light-emitting element configured to receive as input output from the delay-locked loop.

13. The optoelectronic system of claim 12, wherein the phase delay is based, at least in part, on a timing difference between the receive side and the transmit side.

14. The optoelectronic system of claim 12, wherein the phase delay is programmable.

15. The optoelectronic system of claim 12, wherein the delay-locked loop comprises:

a primary delay line coupled to the light-emitting element;

an auxiliary delay line coupled to a dummy load; and a programmable delay line.

16. The optoelectronic system of claim 12, wherein the light-emitting element comprises a vertical cavity surface emitting laser.

17. The optoelectronic system of claim 12, wherein the receive side comprises a photodiode.

18. A method of synchronizing a transmit side and a receive side of an optoelectronic module for an electronic device, the method comprising:

receiving a system clock signal at a transmit side of the optoelectronic module;

decimating the system clock signal to a first frequency;

oversampling the first frequency to a second frequency;

decimating the second frequency to a third frequency;

providing the third frequency as clock input to an arbitrary waveform generator;

providing output of the arbitrary waveform generator as input to a delay-locked loop; and providing output of the delay-locked loop as input to a light-emitting element.

19. The method of claim 18, wherein the arbitrary waveform generator outputs a current waveform.

20. The method of claim 18, wherein the first frequency resets in response to a signal from the receive side of the optoelectronic module.

* * * * *